(12) United States Patent
Sato et al.

(10) Patent No.: US 6,607,964 B2
(45) Date of Patent: Aug. 19, 2003

(54) METHOD OF MANUFACTURING SEMICONDUCTOR DEVICE

(75) Inventors: Hidenori Sato, Tokyo (JP); Shinya Soeda, Tokyo (JP)

(73) Assignee: Mitsubishi Denki Kabushiki Kaisha, Chiyoda-ku (JP)

( * ) Notice: Subject to any disclaimer, the term of this patent is extended or adjusted under 35 U.S.C. 154(b) by 232 days.

(21) Appl. No.: 09/874,110

(22) Filed: Jun. 6, 2001

(65) Prior Publication Data

US 2002/0106855 A1 Aug. 8, 2002

(30) Foreign Application Priority Data

Feb. 6, 2001 (JP) ........................................ 2001-030133

(51) Int. Cl.$^7$ ............................ H01L 21/20; H01L 21/44
(52) U.S. Cl. ..................... 438/396; 438/592; 438/294; 438/303; 438/664; 438/683
(58) Field of Search .......................... 438/396, 197, 438/299, 301, 306, 527, 662, 664, 305, 592, 655, 683, 241, 294, 682, 303, 652, 657, 256

(56) References Cited

U.S. PATENT DOCUMENTS

| | | | | |
|---|---|---|---|---|
| 5,891,785 A | * | 4/1999 | Chang | 438/305 |
| 6,365,446 B1 | * | 4/2002 | Chong et al. | 438/197 |
| 6,436,754 B1 | * | 8/2002 | Lee | 438/238 |

FOREIGN PATENT DOCUMENTS

JP    A 7-235606    9/1995

* cited by examiner

*Primary Examiner*—Matthew Smith
*Assistant Examiner*—Igwe Anya
(74) *Attorney, Agent, or Firm*—Burns, Doane, Swecker & Mathis, LLP

(57) ABSTRACT

A first silicide protection film is deposited on a silicon substrate, a first resist pattern having an opening at a prescribed position is formed, a portion of the first silicide protection film exposed from the opening of the first resist pattern is removed to form a first opening in the first silicide protection film, an $N^+$ diffusion layer is formed in a portion of the silicon substrate exposed from the first opening, the first resist pattern is removed, and a metallic film is deposited to form a first silicide layer on the $N^+$ diffusion layer according to a silicide process. Thereafter, a second silicide protection film is deposited, a second resist pattern having an opening at a prescribed position is formed, portions of the first and second silicide protection films exposed from the opening of the second resist pattern are removed to form a second opening in the first and second silicide protection films, a $P^+$ diffusion layer is formed in a portion of the silicon substrate exposed from the second opening, the second resist pattern is removed, and a metallic film is deposited to form a second silicide layer on the $P^+$ diffusion layer according to the silicide process. Therefore, silicide layers having characteristics optimum to the diffusion layers can be formed, and the number of mask matching operations can be reduced.

3 Claims, 12 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device in which dynamic random access memory (DRAM) and logical circuit are arranged.

2. Description of Related Art

FIG. 10 is a sectional view showing the structure of a semiconductor device in which DRAM and logical circuit are arranged. In FIG. 10, numeral number 1 indicates a semiconductor device (hereinafter, denoting an embedded DRAM, and called eRAM for short). 2 indicates a memory cell unit of a DRAM, 3 indicates the whole field other than the memory cell unit 2 of the DRAM. In the field 3 other than the memory cell unit 2 of the DRAM, a logical circuit and a peripheral circuit of the DRAM are arranged.

Also, 11 indicates a silicon substrate. 12 indicates a bottom n-type (N) well. 13 indicates each of two p-type (P) wells. 14 indicates each of P wells. 15 indicates each of two N wells. 16 indicates an element isolation oxide film. 17 and 18 respectively indicate $N^-$ diffusion layers. 19 indicates an $N^+$ diffusion layer. 20 indicates a $P^-$ diffusion layer. 21 indicates a $P^+$ diffusion layer. 22 to 25 respectively indicate gate electrodes formed in two-layer structure. A plurality of insulation films 22a to 25a are respectively arranged on the gate electrodes 22 to 25. 26 indicates a first side wall of both the gate electrode 24 and the insulation film 24a. 27 indicates a second side wall of both the gate electrode 25 and the insulation film 25a. 28 indicates a bit line. 29 indicates a bottom-of-capacitor electrode. 30 indicates a top-of-capacitor electrode. 31 indicates a dielectric film arranged between the bottom-of-capacitor electrode 29 and the top-of-capacitor electrode 30. 32 to 37 respectively indicate interlayer insulation films. 38 to 41 respectively indicate metallic wires. 42 indicates a contact hole. 43 to 45 respectively indicate via holes. 46 indicates a metallic layer embedded in the contact hole 42. 47 to 49 respectively indicate metallic layers embedded in the via holes 43 to 45. 50 indicates a glass coat.

In the memory cell unit 2 of the DRAM shown in FIG. 10, only principal elements of the memory cell unit 2 are shown. That is, an n-channel metal oxide semiconductor (NMOS) having the gate electrode 22 and a capacitor which is composed of the bottom-of-capacitor electrode 29, the top-of-capacitor electrode 30 and the dielectric film 31 connected with the $N^-$ diffusion layer 17 of the NMOS are shown in FIG. 10 as principal elements of the memory cell unit 2 of the DRAM. Also, the bit line 28 connected with the $N^-$ diffusion layer 17 of the NMOS and the gate electrode 23 composing an NMOS of another memory cell are shown in FIG. 10 as other principal elements of the memory cell unit 2 of the DRAM.

Also, in the field 3 other than the memory cell unit 2 of the DRAM shown in FIG. 10, only principal elements of the field 3 are shown in FIG. 10. That is, as shown in FIG. 10, an NMOS having the first side wall spacer 26 and a PMOS having the second side wall spacer 27 are arranged in the field 3 as a logical circuit or a peripheral circuit of the DRAM.

In the logical circuit of a conventional eRAM, to perform high speed operations, a silicide layer (not shown) formed of $CoSi_2$ or the like is formed on both the $N^+$ diffusion layer 19, which has the first side wall spacer 26 and functions as a source/drain diffusion layer of the NMOS, and the $P^+$ diffusion layer 21 which has the second side wall spacer 27 and functions as a source/drain diffusion layer of the PMOS, to reduce resistance in each of the $^+$ diffusion layer 19 and the $P^+$ diffusion layer 21.

In contrast, in the peripheral circuit of the DRAM of the conventional eRAM, no silicide layer is formed on both the $N^+$ diffusion layer 19, which has the first side wall spacer 26 and functions as a source/drain diffusion layer of the NMOS, and the $P^+$ diffusion layer 21 which has the second side wall spacer 27 and functions as a source/drain diffusion layer of the PMOS. Here, in the peripheral circuit of the DRAM, in addition to a MOS transistor having a wall side spacer, a MOS transistor such as a high withstand-pressure MOS transistor having no side wall spacer exists.

Next, a conventional manufacturing method of the eRAM 1 shown in FIG. 10 will be described below.

FIG. 11A, FIG. 11B, FIG. 11C, FIG. 12A, FIG. 12B, FIG. 12C, FIG. 13A and FIG. 13B are respectively sectional views showing conventional steps of forming the eRAM in the step order. In FIG. 11A to FIG. 13B, steps of forming the NMOS arranged in the memory cell unit 2 of the DRAM are shown on the left side, and steps of forming both the NMOS with the first side wall spacer 26 and the PMOS with the second side wall spacer 27, which are arranged in the field 3 other than the memory cell unit 2 of the DRAM, are shown on the right side. However, in the peripheral circuit of the DRAM, no silicide layer is formed on both the $N^+$ diffusion layer 19 having the first side wall spacer 26 and the $P^+$ diffusion layer 21 having the second side wall spacer 27. Therefore, both the NMOS with the first side wall spacer 26 and the PMOS with the second side wall spacer 27 shown on the right side of the FIG. 12C, FIG. 13A and FIG. 13B are limited to those arranged in the logical circuit, and the steps of forming a silicide layer are shown in FIG. 12C, FIG. 13A and FIG. 13B. Here, in FIG. 11A to FIG. 13B, the bottom N well 12, the P wells 13 and 14, the N wells 15, a gate oxide film, the $N^-$ diffusion layers 17 and 18, the $N^+$ diffusion layer 19, the $P^-$ diffusion layer 20 and the $P^+$ diffusion layer 21 are omitted and not shown.

When eRAM is manufactured according to a conventional method, the bottom N well 12, the P wells 13 and 14 and the N wells 15 are initially formed in the silicon substrate 11. Thereafter, the element isolation oxide film 16 is formed in the silicon substrate 11. Thereafter, a gate oxide film is formed on the silicon substrate 11. Thereafter, the gate electrodes 22 to 25, on which the insulation films 22a to 25a are respectively arranged, are formed on the gate oxide film. Thereafter, to form the $N^-$ diffusion layers 17 and 18 respectively in the memory cell unit 2 of the DRAM and the field 3 other than the memory cell unit 2 of the DRAM, a resist pattern having a plurality of openings at prescribed positions is formed on the silicon substrate 11. Thereafter, ions of n-type impurity are injected into the silicon substrate 11 through the openings of the resist pattern, and the $N^-$ diffusion layers 17 and 18 are formed in an upper portion of the silicon substrate 11. Thereafter, the resist pattern is removed. Thereafter, to form the $P^-$ diffusion layer 20 in the field 3 other than the memory cell unit 2 of the DRAM, another resist pattern having an opening at a prescribed position is formed on the silicon substrate 11. Thereafter, ions of p-type impurity are injected into the silicon substrate 11 through the opening of the resist pattern, and the $P^-$ diffusion layer 20 is formed in the upper portion of the silicon substrate 11. Thereafter, the resist pattern is removed. Thereafter, a side wall spacer forming film 101 formed of silicon nitride film is deposited on the whole surface area (refer to FIG. 11A).

Thereafter, to form the N⁺ diffusion layer 19 as a source/drain diffusion layer of the NMOS in the field 3 other than the memory cell unit 2 of the DRAM, a first resist pattern 103 having an opening 102 at a prescribed position is formed on the side wall spacer forming film 101. Thereafter, anisotropic etching is performed for a portion of the side wall spacer forming film 101 which is exposed from the opening 102 of the first resist pattern 103, and the first side wall spacer 26 is formed on a side wall of the gate electrode 24 of the NMOS. Thereafter, ions of n-type impurity are injected into the silicon substrate 11 through the opening 102 of the first resist pattern 103, and the N⁺ diffusion layer 19 is formed in the upper portion of the silicon substrate 11 (refer to FIG. 11B). Thereafter, the first resist pattern 103 is removed.

Thereafter, to form the P⁺ diffusion layer 21 as a source/drain diffusion layer of the PMOS in the field 3 other than the memory cell unit 2 of the DRAM, a second resist pattern 105 having an opening 104 at a prescribed position is formed on the side wall spacer forming film 101. Thereafter, anisotropic etching is performed for a portion of the side wall spacer forming film 101 which is exposed from the openings 104 of the second resist pattern 105, and the second side wall spacer 27 is formed on a side wall of the gate electrode 25 of the PMOS. Thereafter, ions of p-type impurity are injected into the silicon substrate 11 through the opening 104 of the second resist pattern 105, and the P⁺ diffusion layer 21 is formed in the upper portion of the silicon substrate 11 (refer to FIG. 11C). Thereafter, the second resist pattern 105 is removed (refer to FIG. 12A).

Thereafter, a silicide protection film 106 is deposited on the whole surface area (refer to FIG. 12B). The silicide protection film 106 is formed of TEOS oxide film (that is, silicon oxide film made of tetra-ethyl-ortho-silicate material).

Thereafter, to form a silicide layer on both the N⁺ diffusion layer 19 of the NMOS having the first side wall spacer 26 and the P⁺ diffusion layer 21 of the PMOS having the second side wall spacer 27 in the logical circuit, a third resist pattern 108, which has a plurality of openings 107 at prescribed positions, is formed on the whole surface area so as to place the openings 107 on the N⁺ diffusion layer 19 and the P⁺ diffusion layer 21 through the silicide protection film 106. Thereafter, portions of the silicide protection film 106 exposed from the openings 107 of the third resist pattern 108 are removed by etching (refer to FIG. 12C). As a result, a first opening 109 placing on the N⁺ diffusion layer 19 and a second opening 110 placing on the P⁺ diffusion layer 21 are formed on the silicide protection film 106. Thereafter, the third resist pattern 108 is removed (refer to FIG. 13A).

Thereafter, a metallic film made of cobalt is deposited on the whole surface area. Thereafter, a silicide process is performed. That is, a first silicide layer 111 made of $CoSi_2$ is formed on the N⁺ diffusion layer 19 of the NMOS exposed from the first opening 109, and a second silicide layer 112 made of $CoSi_2$ is formed on the P⁺ diffusion layer 21 of the PMOS exposed from the second opening 110 (refer to FIG. 13B). In this silicide process, thermal processing is initially performed for the metallic film at a low temperature according to a ramp anneal method, and the metallic film deposited on both the N⁺ diffusion layer 19 and the P⁺ diffusion layer 21 is silicified. Thereafter, non-silicified metallic film is removed by etching. Thereafter, thermal processing is performed for the silicified metallic film at a high temperature, and a di-silicide metallic film is formed out of the silicified metallic film.

Thereafter, the silicide protection film 106 not yet removed is removed by etching. Thereafter, the interlayer insulation film 32 is deposited on the whole surface area. Thereafter, the other constituent elements shown in FIG. 10 are formed.

Therefore, in the logical circuit of the field 3, the eRAM is manufactured on condition that the silicide layers (or the di-silicide metallic film) made of $CoSi_2$ are respectively formed on the N⁺ diffusion layer 19 of the NMOS having the first side wall spacer 26 and the P⁺ diffusion layer 21 of the PMOS having the second side wall spacer 27.

In the conventional manufacturing method of the eRAM performed according to the above-described steps, because characteristics of the silicide layer formed on the N⁺ diffusion layer 19 are the same as the characteristics of the silicide layer formed on the P⁺ diffusion layer 21 in the logical circuit, there is a problem that an optimum silicide layer, which has the characteristics (for example, diffusion resistance, junction leak current between diffusion layers, and contact resistance for diffusion layer) required for the eRAM, cannot be formed on each of the N⁺ diffusion layer 19 and the P⁺ diffusion layer 21.

Also, in the conventional manufacturing method of the eRAM, the silicide protection film is deposited after the formation of both the N⁺ diffusion layer 19 and the P⁺ diffusion layer 21. Therefore, there is another problem that a mask for forming the third resist pattern 108 used only to form the openings 109 and 110 in the silicide protection film is required and a mask matching operation is required for the mask.

SUMMARY OF THE INVENTION

A main object of the present invention is to provide, with due consideration to the drawbacks of the conventional manufacturing method of the eRAM, a manufacturing method of a semiconductor device in which a silicide layer having characteristics optimum to an N⁺ diffusion layer and a silicide layer having characteristics optimum to a P⁺ diffusion layer are formed.

Also, a subordinate object of the present invention is to provide a manufacturing method of a semiconductor device in which a mask for the formation of a resist pattern used only to form an opening in a silicide protection film is not required and the number of mask matching operations is reduced.

The main object and the subordinate object are achieved by the provision of a manufacturing method of a semiconductor device, in which a dynamic random access memory and a logical circuit are arranged, comprising a step of depositing a side wall spacer forming film and a first silicide protection film after forming a gate electrode on a gate oxide film formed on a silicon substrate, a step of forming a first resist pattern having an opening at a prescribed position corresponding to a source/drain diffusion layer of a first conductive channel MOS transistor after depositing the first silicide protection film, a step of removing a portion of the first silicide protection film exposed from the opening of the first resist pattern after the formation of the first resist pattern to form a first opening in the first silicide protection film, a step of forming a fist side wall spacer on a side wall of a gate electrode of the first conductive channel MOS transistor after the formation of the first opening and forming the source/drain diffusion layer of the first conductive channel MOS transistor, a step of removing the first resist pattern and forming a first silicide layer on the source/drain diffusion layer of the first conductive channel MOS transistor exposed from the first opening of the first silicide protection film, a step of depositing a second silicide protection film after the formation of the first silicide layer, a step of forming a second resist pattern having an opening at a prescribed position corresponding to a source/drain diffusion layer of a second conductive channel MOS transistor after depositing the second silicide protection film, a step of removing a portion of the second silicide protection film and a portion of the first silicide protection film exposed from the opening of the second resist pattern after the formation of the second resist pattern to form a second opening penetrating the second silicide protection film and the first silicide protection film, a step of forming a second side wall spacer on a side wall of a gate electrode of the second conductive channel MOS transistor after the formation of the second opening and forming the source/drain diffusion layer of the second conductive channel MOS transistor, and a step of removing the second resist pattern and forming a second silicide layer on the source/drain diffusion layer of the second conductive channel MOS transistor exposed from the second opening of both the second silicide protection film and the first silicide protection film.

In the above steps, the step of forming the first silicide layer on the source/drain diffusion layer of the first conductive channel MOS transistor differs from the step of forming the second silicide layer on the source/drain diffusion layer of the second conductive channel MOS transistor. Also, no resist pattern is used only to form the opening in the silicide protection film.

Accordingly, a silicide layer having characteristics optimum to the source/drain diffusion layer of the first conductive channel MOS transistor and a silicide layer having characteristics optimum to the source/drain diffusion layer of the second conductive channel MOS transistor can be formed. Also, a mask for the formation of a resist pattern used only to form the opening in the silicide protection film is not required, and the number of mask matching operations can be reduced.

The main object and the subordinate object are also achieved by the provision of a manufacturing method of a semiconductor device, in which a dynamic random access memory and a logical circuit are arranged, comprising a step of depositing a side wall spacer forming film and a silicide protection film after forming a gate electrode on a gate oxide film formed on a silicon substrate, a step of forming a first resist pattern having an opening at a prescribed position corresponding to a source/drain diffusion layer of a first conductive channel MOS transistor after depositing the silicide protection film, a step of removing a portion of the silicide protection film exposed from the opening of the first resist pattern after the formation of the first resist pattern to form a first opening in the silicide protection film, a step of forming a fist side wall spacer on a side wall of a gate electrode of the first conductive channel MOS transistor after the formation of the first opening and forming the source/drain diffusion layer of the first conductive channel MOS transistor, a step of removing the first resist pattern and forming a first silicide layer on the source/drain diffusion layer of the first conductive channel MOS transistor exposed from the first opening of the silicide protection film, a step of forming a second resist pattern having an opening at a prescribed position corresponding to a source/drain diffusion layer of a second conductive channel MOS transistor after the formation of the first silicide layer, a step of removing a portion of the silicide protection film exposed from the opening of the second resist pattern after the formation of the second resist pattern to form a second opening in the silicide protection film, a step of forming a second side wall spacer on a side wall of a gate electrode of the second conductive channel MOS transistor after the formation of the second opening and forming the source/drain diffusion layer of the second conductive channel MOS transistor, and a step of removing the second resist pattern, forming a second silicide layer on the source/drain diffusion layer of the second conductive channel MOS transistor exposed from the second opening of the silicide protection film and forming a third silicide layer on the first silicide layer exposed from the first opening of the silicide protection film.

In the above steps, the step of forming the first silicide layer on the source/drain diffusion layer of the first conductive channel MOS transistor differs from the step of forming the second silicide layer on the source/drain diffusion layer of the second conductive channel MOS transistor. Also, no resist pattern is used only to form the opening in the silicide protection film.

Accordingly, a silicide layer having characteristics optimum to the source/drain diffusion layer of the first conductive channel MOS transistor and a silicide layer having characteristics optimum to the source/drain diffusion layer of the second conductive channel MOS transistor can be formed. Also, a mask for the formation of a resist pattern used only to form the opening in the silicide protection film is not required, and the number of mask matching operations can be reduced.

The main object is achieved by the provision of a manufacturing method of a semiconductor device, in which a dynamic random access memory and a logical circuit are arranged, comprising a step of depositing a side wall spacer forming film after forming a gate electrode on a gate oxide film formed on a silicon substrate, a step of forming a first resist pattern having an opening at a prescribed position corresponding to a source/drain diffusion layer of a first conductive channel MOS transistor after depositing the side wall spacer forming film, a step of forming a fist side wall spacer on a side wall of a gate electrode of the first conductive channel MOS transistor after the formation of the first resist pattern and forming the source/drain diffusion layer of the first conductive channel MOS transistor, a step of removing the first resist pattern and forming a second resist pattern having an opening at a prescribed position corresponding to a source/drain diffusion layer of a second conductive channel MOS transistor, a step of forming a second side wall spacer on a side wall of a gate electrode of the second conductive channel MOS transistor after the formation of the second resist pattern and forming the source/drain diffusion layer of the second conductive channel MOS transistor, a step of removing the second resist pattern and depositing a silicide protection film, a step of forming a third resist pattern having a plurality openings so as to place one opening on the source/drain diffusion layer of the first conductive channel MOS transistor through the silicide protection film and to place another opening on the source/drain diffusion layer of the second conductive channel MOS transistor through the silicide protection film, a step of removing portions of the silicide protection film exposed from the openings of the third resist pattern after the formation of the third resist pattern to form both a first opening placing on the source/drain diffusion layer of the first conductive channel MOS transistor and a second opening placing on the source/drain diffusion layer of the second conductive channel MOS transistor in the silicide protection film, a step of forming a first silicide layer on the source/drain diffusion layer of the first conductive channel MOS transistor exposed from the first opening of the silicide protection film and forming a second silicide layer on the source/drain diffusion layer of the second conductive channel MOS transistor exposed from the second opening of the silicide protection film, a step of removing the second silicide layer, and a step of forming a third silicide layer in a space, from which the second silicide layer is removed and which is exposed from the second opening of the silicide protection film, and forming a fourth silicide layer on the first silicide layer exposed from the first opening of the silicide protection film.

In the above steps, the step of forming the first silicide layer on the source/drain diffusion layer of the first conductive channel MOS transistor differs from the step of forming the second silicide layer on the source/drain diffusion layer of the second conductive channel MOS transistor.

Accordingly, a silicide layer having characteristics optimum to the source/drain diffusion layer of the first conductive channel MOS transistor and a silicide layer having characteristics optimum to the source/drain diffusion layer of the second conductive channel MOS transistor can be formed.

DETAILED DESCRIPTION OF THE PREFERRED EMBODIMENTS

Embodiments of the present invention will now be described with reference to the accompanying drawings.

Figure 10:
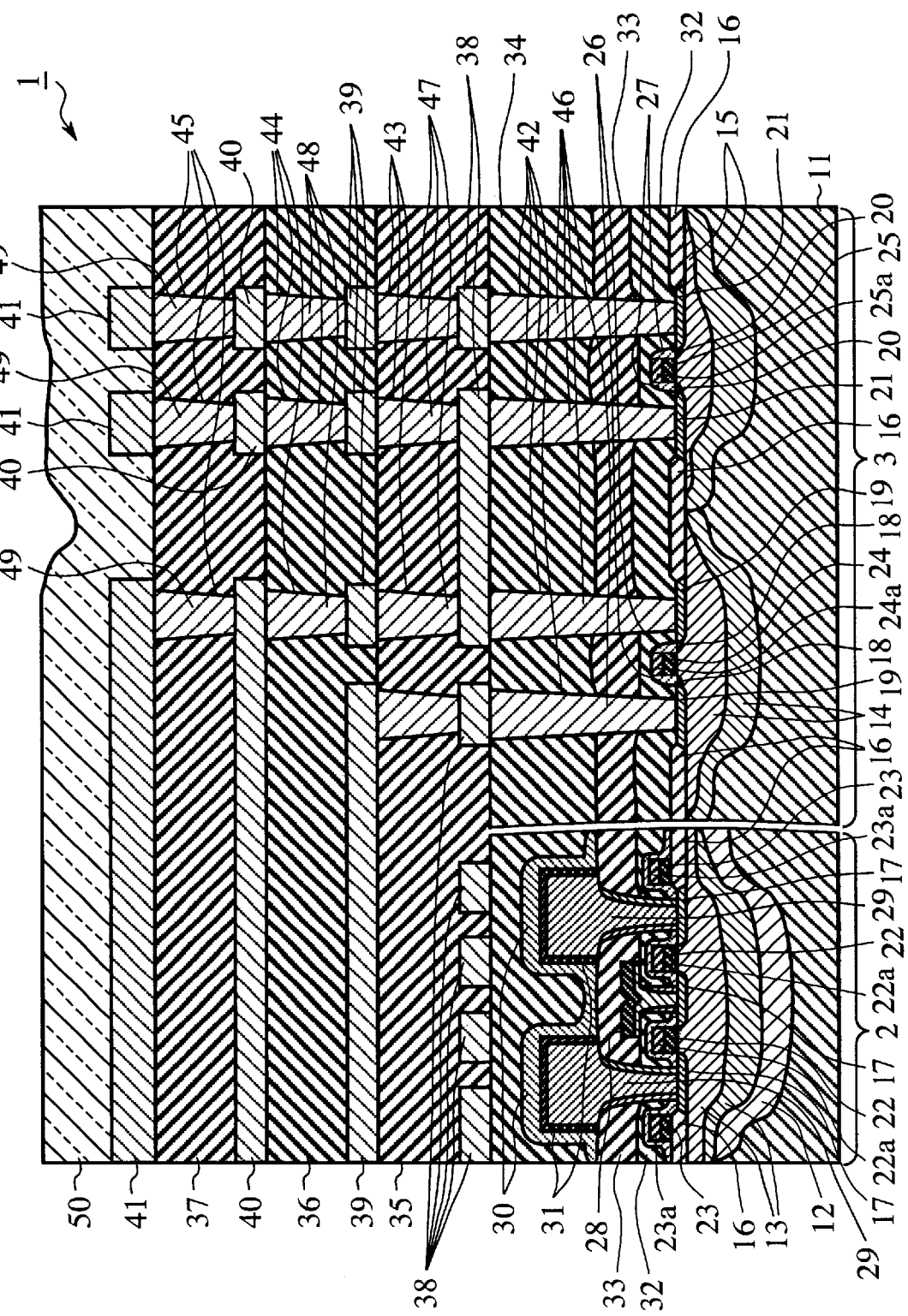
FIG. 10 is a sectional view showing the structure of a semiconductor device in which DRAM and logical circuit are arranged.
Figure 11A:
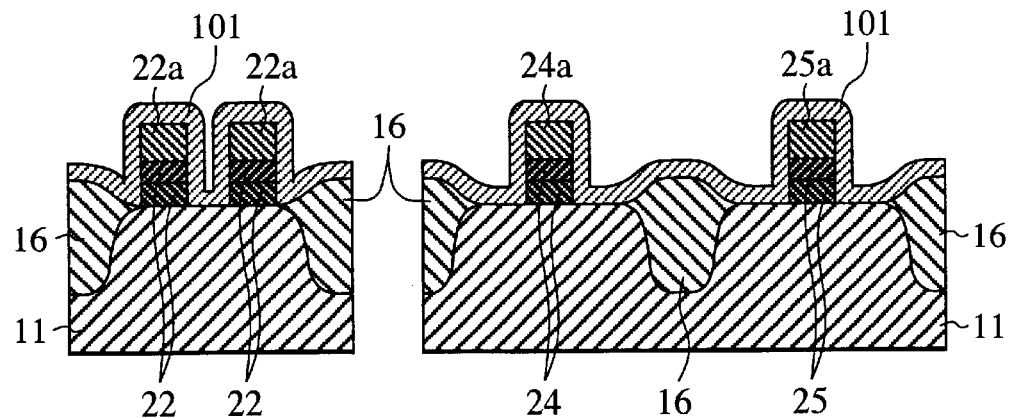
FIG. 11A, FIG. 11B, FIG. 11C, FIG. 12A, FIG. 12B, FIG. 12C, FIG. 13A and FIG. 13B are respectively sectional views showing conventional steps of forming the eRAM in the step order.
Figure 11B:
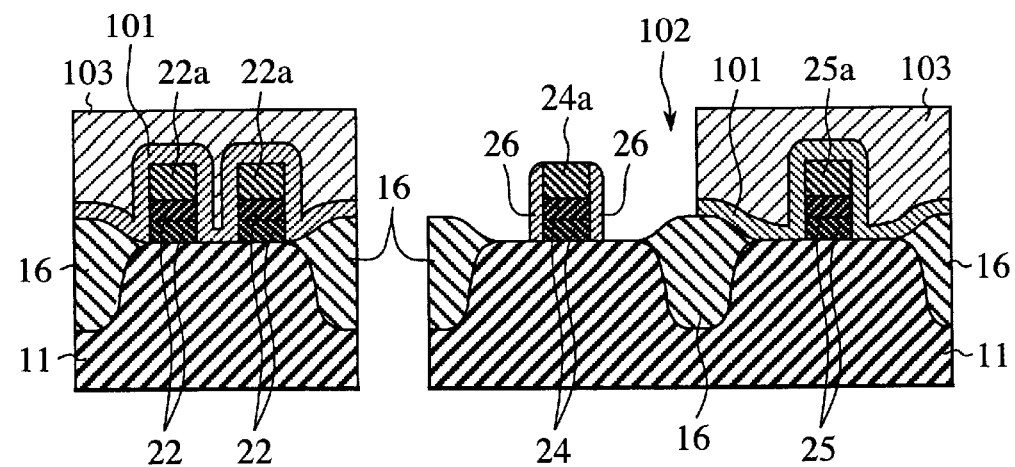
Figure 11C:
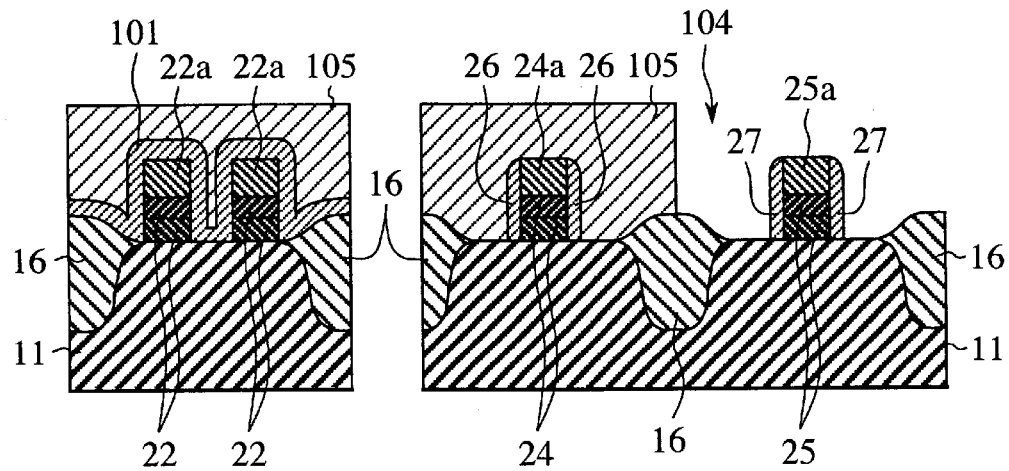
Figure 12A:
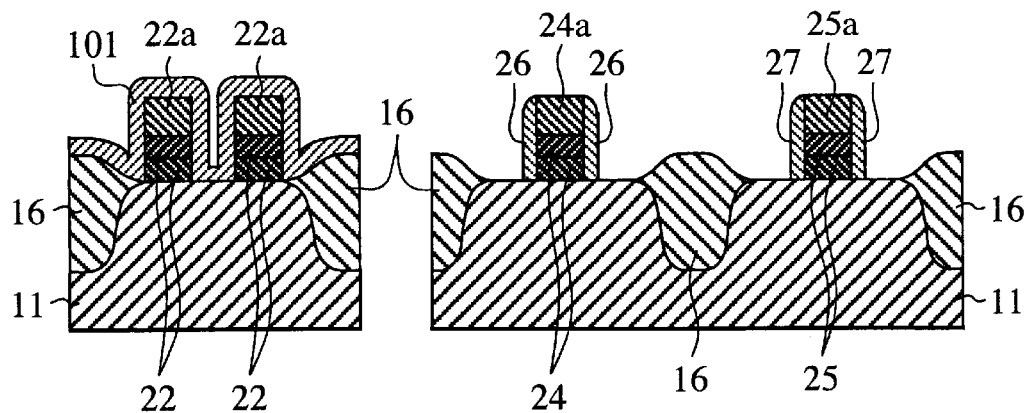
Figure 12B:
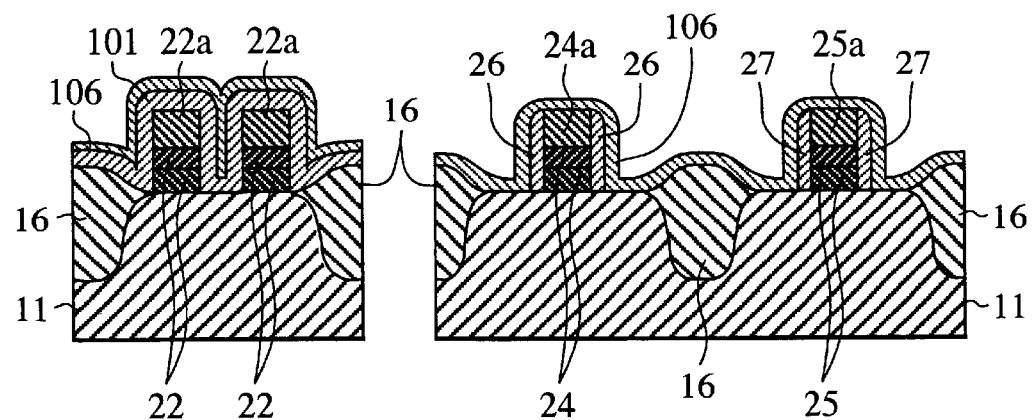
Figure 12C:
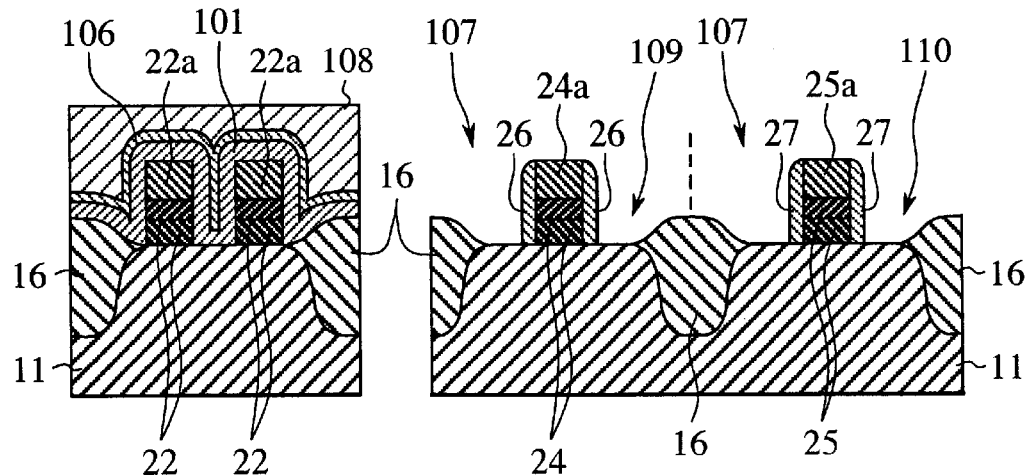
Figure 13A:
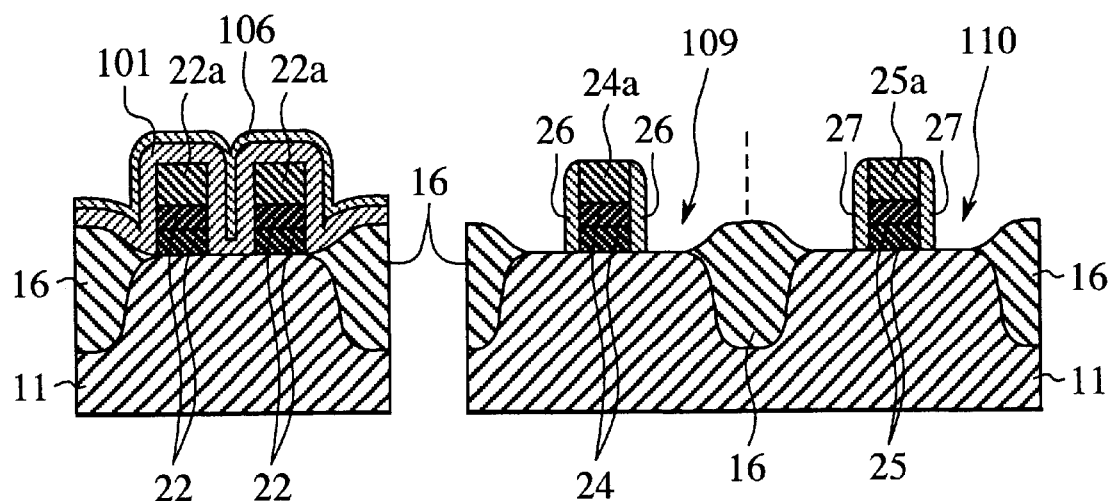
Figure 13B:
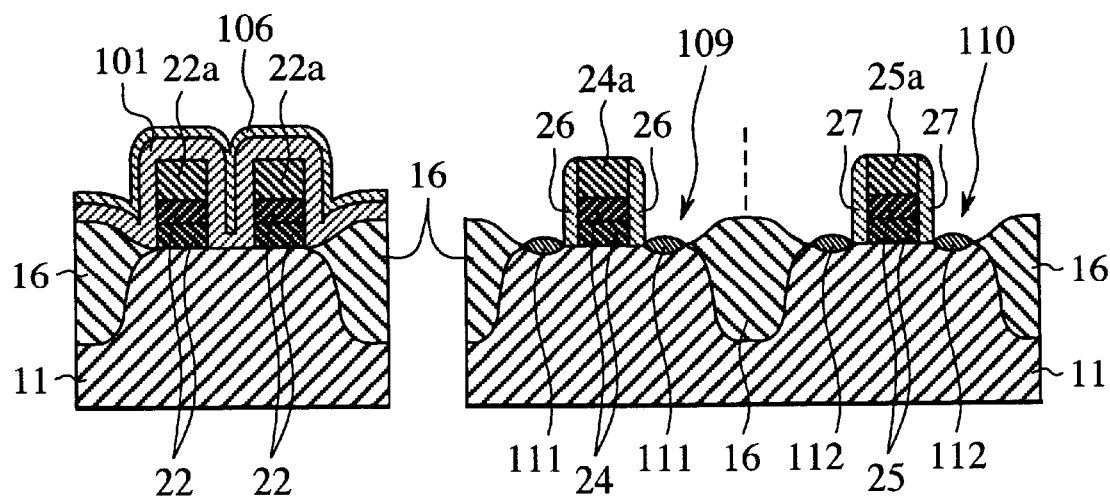

In each of following embodiments, a manufacturing method of an eRAM similar to the eRAM shown in FIG. 10 is described. The difference of the eRAM according to each embodiment from that shown in FIG. 10 is in that a silicide layer placed on the N$^+$ diffusion layer 19 of the NMOS having the first side wall spacer 26 and a silicide layer placed on the P$^+$ diffusion layer 21 of the PMOS having the second side wall spacer 27 are additionally formed in the peripheral circuit of the DRAM, and the silicide layers formed on the N$^+$ diffusion layers 19 having the first side wall spacers 26 in the logical circuit and the peripheral circuit of the DRAM differ from the silicide layers formed on the P$^+$ diffusion layers 21 having the second side wall spacers 27 in the logical circuit and the peripheral circuit of the DRAM.

Embodiment 1

FIG. 1A, FIG. 1B, FIG. 1C, FIG. 2A, FIG. 2B, FIG. 2C, FIG. 3A, FIG. 3B and FIG. 3C are respectively sectional views showing steps of forming an eRAM in the step order according to a first embodiment of the present invention. In FIG. 1A to FIG. 3C, steps of forming an NMOS arranged in the memory cell unit 2 of a DRAM are shown on the left side, and steps of forming both an NMOS with the first side wall spacer 26 and a PMOS with the second side wall spacer 27, which are arranged in the field 3 other than the memory cell unit 2 of the DRAM, are shown on the right side. Here, in FIG. 1A to FIG. 3C, the bottom N well 12, the P wells 13 and 14, the N wells 15, a gate oxide film, the N$^-$ diffusion layers 17 and 18, the N$^+$ diffusion layer 19, the P$^-$ diffusion layer 20 and the P$^+$ diffusion layer 21 are omitted and not shown.

When eRAM is manufactured according to a first embodiment, the bottom N well 12, the P wells 13 and 14 and the N wells 15 are formed in the silicon substrate 11. Thereafter, the element isolation oxide film 16 is formed on the P wells 13 and 14 and the N well 15. Thereafter, a gate oxide film is formed on the element isolation oxide film 16. Thereafter, the gate electrodes 22 to 25 of the two-layer structure and the insulation films 22a to 25a placed on the gate electrodes 22 to 25 are formed on the gate oxide film. Thereafter, to form the N$^-$ diffusion layer 17 of an NMOS in the memory cell unit 2 of the DRAM and to form the N$^-$ diffusion layer 18 of an NMOS in the field 3 other than the memory cell unit 2 of the DRAM, a resist pattern having a plurality of openings at prescribed positions is formed on the silicon substrate 11. Thereafter, ions of n-type impurity are injected into the silicon substrate 11 through the openings of the resist pattern, and the N$^-$ diffusion layers 17 and 18 are formed in an upper portion of the silicon substrate 11. Thereafter, the resist pattern is removed. Thereafter, to form the P$^-$ diffusion layer 20 in the PMOS field 3 other than the memory cell unit 2 of the DRAM, another resist pattern having an opening at a prescribed position is formed on the silicon substrate 11. Thereafter, ions of p-type impurity are injected into the silicon substrate 11 through the opening of the resist pattern, and the P$^-$ diffusion layer 20 is formed in the upper portion of the silicon substrate 11. Thereafter, the resist pattern is removed. Thereafter, a side wall spacer forming film 51 formed out of silicon nitride film is deposited on the whole surface area (refer to FIG. 1A).

Figure 1A:
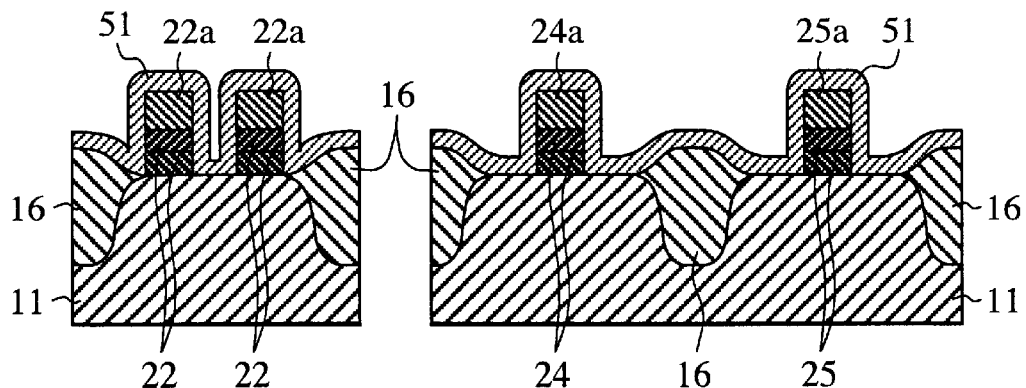
FIG. 1A, FIG. 1B, FIG. 1C, FIG. 2A, FIG. 2B, FIG. 2C, FIG. 3A, FIG. 3B and FIG. 3C are respectively sectional views showing steps of forming an eRAM in the step order according to a first embodiment of the present invention.
Figure 1B:
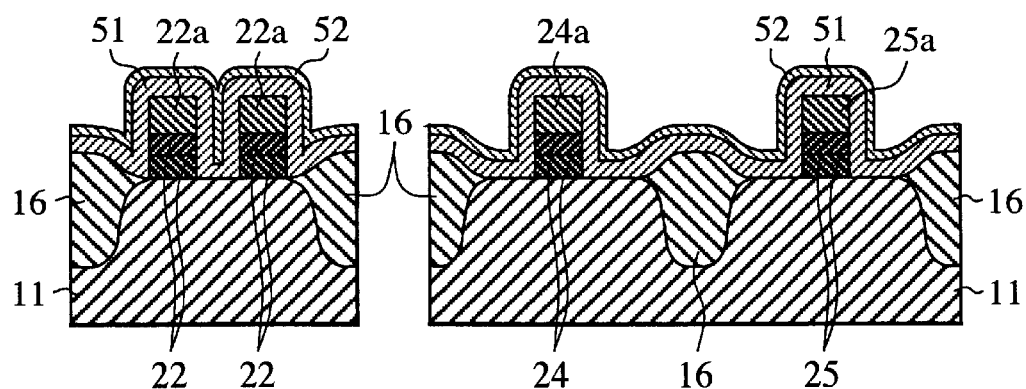
Figure 1C:
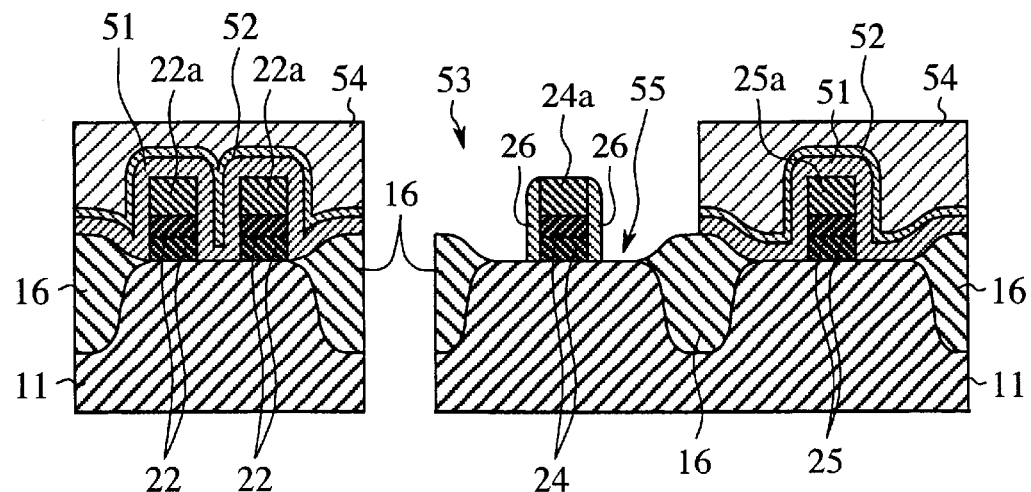

Thereafter, a first silicide protection film 52 formed out of TEOS oxide film is deposited on the side wall spacer forming film 51 (refer to FIG. 1B).

Thereafter, to form both the N$^+$ diffusion layer 19 functioning as a source/drain diffusion layer of the NMOS of the logical circuit and the N$^+$ diffusion layer 19 functioning as a source/drain diffusion layer of the NMOS of the peripheral circuit of the DRAM in the field 3 other than the memory cell unit 2 of the DRAM, a resist pattern (or a first resist pattern) 54 having a plurality of openings 53 at prescribed positions is formed on the first silicide protection film 52. Thereafter, portions of the first silicide protection film 52, which are exposed from the openings 53 of the resist pattern 54, are removed by etching. As a result, a plurality of first openings 55, which are placed at the same positions as those of the openings 53 of the resist pattern 54 and have the same shapes as those of the openings 53 of the resist pattern 54, are formed in the first silicide protection film 52. Thereafter, anisotropic etching is performed for portions of the side wall spacer forming film 51 exposed from the openings 53 of the resist pattern 54, and the first side wall spacers 26 are respectively formed on a side wall of the gate electrode 24 of the NMOS of the logical circuit and a side wall of the gate electrode 24 of the NMOS of the peripheral circuit of the DRAM. Thereafter, ions of n-type impurity are injected into the silicon substrate 11 through the openings 53 of the resist pattern 54 to form the N+ diffusion layers 19 in the upper portion of the silicon substrate 11 (refer to FIG. 1C). Thereafter, the resist pattern 54 is removed (refer to FIG. 2A).

Thereafter, a metallic film made of cobalt is deposited on the whole surface area. Thereafter, the silicide process is performed. In this case, because the first openings 55 are formed in the first silicide protection film 52 by using the resist pattern 54 which is used to form the N+ diffusion layers 19, the whole surface of the N+ diffusion layers 19 is exposed from the first openings 55. Therefore, a first silicide layer 56 made of $CoSi_2$ is formed on the N+ diffusion layer 19 of the NMOS, which is exposed from one first opening 55 of the first silicide protection film 52, in the logical circuit, and another first silicide layer 56 made of $CoSi_2$ is formed on the N+ diffusion layer 19, which is exposed from another first opening 55 of the first silicide protection film 52, in the NMOS of the peripheral circuit of the DRAM (refer to FIG. 2B).

Figure 2A:
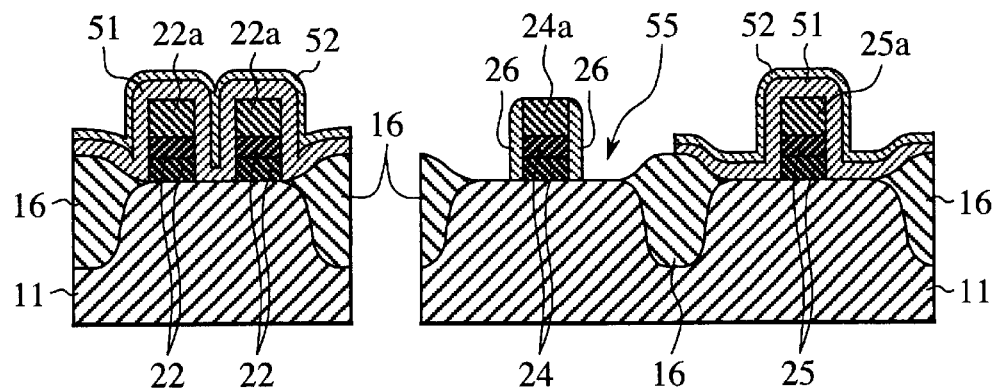
Figure 2B:
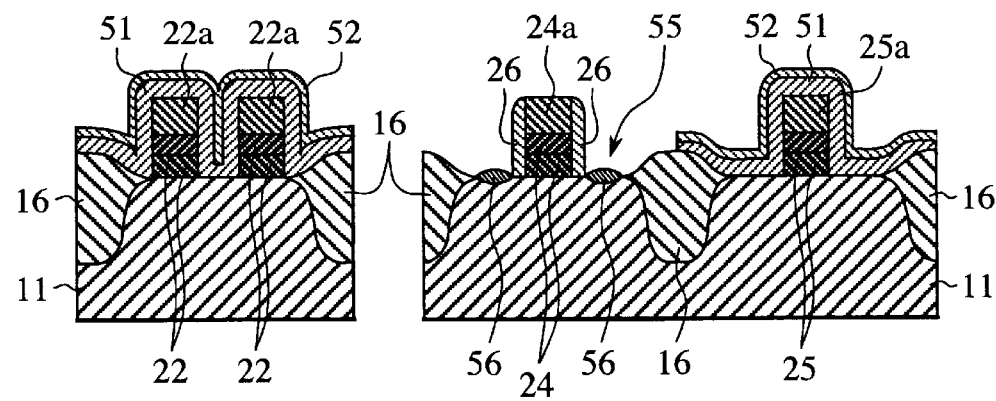
Figure 2C:
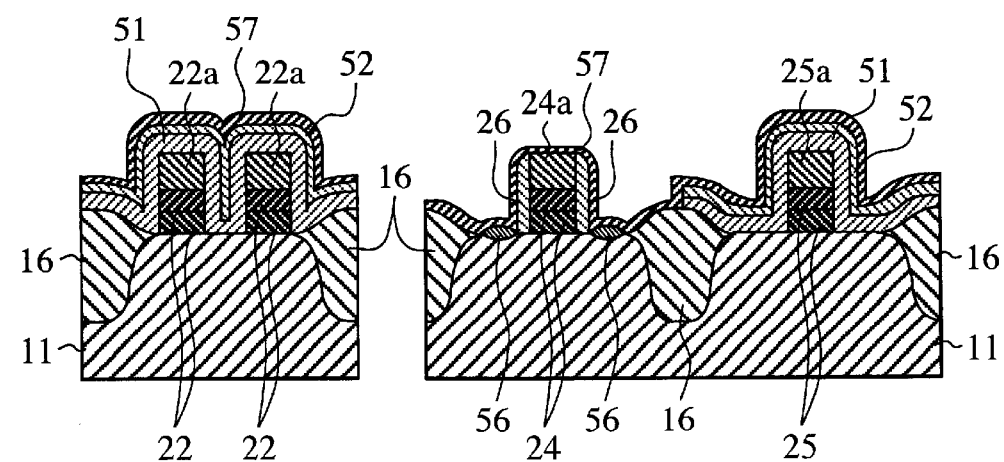
Figure 3A:
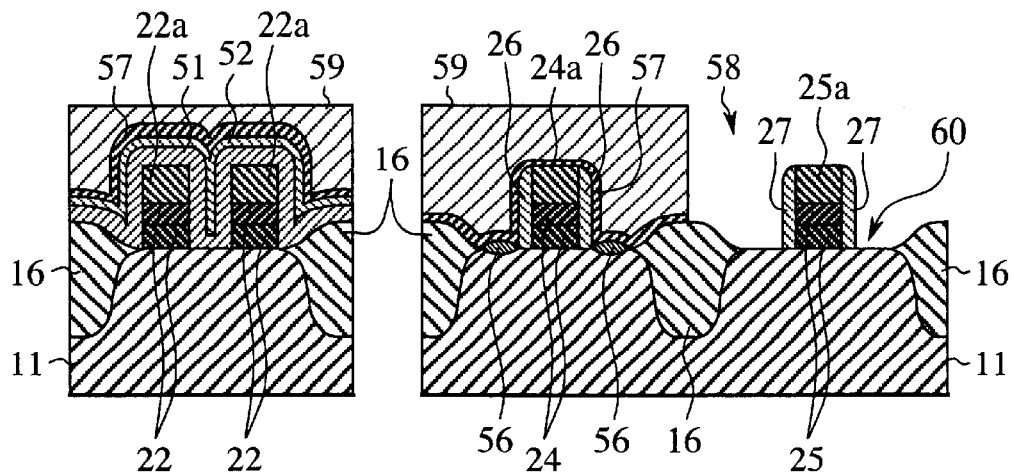
Figure 3B:
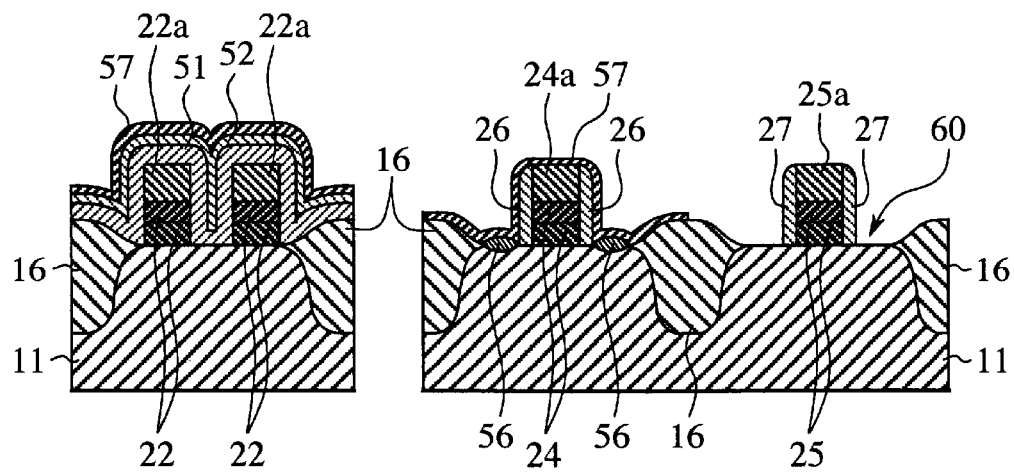
Figure 3C:
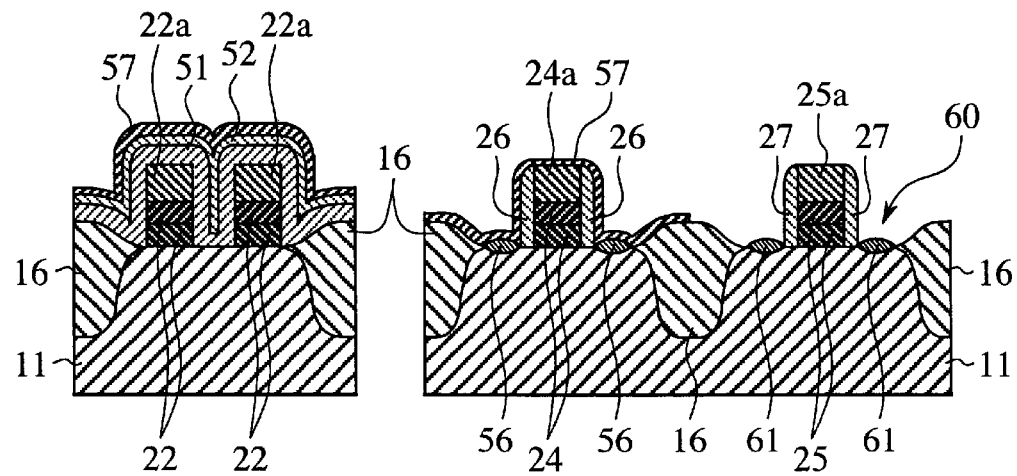

Thereafter, a second silicide protection film 57 formed out of TEOS oxide film is deposited on the whole surface area (refer to FIG. 2C).

Thereafter, to form both the P+ diffusion layer 21 functioning as a source/drain diffusion layer of the PMOS of the logical circuit and the P+ diffusion layer 21 functioning as a source/drain diffusion layer of the PMOS of the peripheral circuit of the DRAM in the field 3 other than the memory cell unit 2 of the DRAM, a resist pattern (or a second resist pattern) 59 having a plurality of openings 58 at prescribed positions is formed on the second silicide protection film 57. Thereafter, portions of the second silicide protection film 57 and portions of the first silicide protection film 52, which are exposed from the openings 58 of the resist pattern 59, are removed by etching. As a result, each of a plurality of second openings 60, which are placed at the same positions as those of the openings 58 of the resist pattern 59 and have the same shapes as those of the openings 58 of the resist pattern 59, penetrates both the second silicide protection film 57 and the first silicide protection film 52. Thereafter, anisotropic etching is performed for portions of the side wall spacer forming film 51 exposed from the openings 58 of the resist pattern 59, and the second side wall spacers 27 are respectively formed on a side wall of the gate electrode 25 of the PMOS of the logical circuit and a side wall of the gate electrode 25 of the PMOS of the peripheral circuit of the DRAM. Thereafter, ions of p-type impurity are injected into the silicon substrate 11 through the openings 58 of the resist pattern 59 to form the P+ diffusion layers 21 in the upper portion of the silicon substrate 11 (refer to FIG. 3A). Thereafter, the resist pattern 59 is removed (refer to FIG. 3B).

Thereafter, a metallic film made of cobalt is deposited on the whole surface area. Thereafter, the silicide process is performed. In this case, because the second openings 60 are formed in both the second silicide protection film 57 and the first silicide protection film 52 by using the resist pattern 59 which is used to form the P+ diffusion layers 21, the whole surface of the P+ diffusion layers 21 is exposed from the second openings 60. Therefore, a second silicide layer 61 made of $CoSi_2$ is formed on the P+ diffusion layer 21 of the PMOS, which is exposed from one second opening 60 of the silicide protection films 52 and 57, in the logical circuit, and another second silicide layer 61 made of $CoSi_2$ is formed on the P+ diffusion layer 21 of the PMOS, which is exposed from the other second opening 60 of the silicide protection films 52 and 57, in the peripheral circuit of the DRAM (refer to FIG. 3C).

Thereafter, the first silicide protection film 52 and the second silicide protection film 57 not yet removed are removed by etching. Thereafter, the interlayer insulation film 32 is deposited on the whole surface area. Thereafter, the other constitutional components shown in FIG. 10 are formed.

Therefore, the eRAM is manufactured on condition that the first silicide layer 56 or the second silicide layer 61 made of $CoSi_2$ is formed on each of the N+ diffusion layers 19 of the NMOS having the first side wall spacer 26 and the P+ diffusion layers 21 of the PMOS having the second side wall spacer 27 which are arranged in the logical circuit and the peripheral circuit of the DRAM.

As is described above, in the first embodiment, the forming step of the first silicide layers 56 placed on the N+ diffusion layers 19 differs from that of the second silicide layers 61 placed on the P+ diffusion layers 21. Accordingly, film thickness and quality of the first silicide layers 56 can be adjusted independent of the adjustment of film thickness and quality of the second silicide layers 61, and silicide layers having characteristics optimum to the N+ diffusion layers 19 and silicide layers having characteristics optimum to the P+ diffusion layers 21 can be reliably formed.

Also, in the first embodiment, the first openings 55 are formed in the first silicide protection film 52 by using the resist pattern 54 used for the formation of the N+ diffusion layers 19, and the first silicide layers 56 placed on the N+ diffusion layers 19 are formed by using the first openings 55. Also, the second openings 60 are formed in the silicide protection films 52 and 57 by using the resist pattern 59 used for the formation of the P+ diffusion layers 21, and the second silicide layers 61 placed on the P+ diffusion layers 21 are formed by using the second openings 60. Therefore, a resist pattern, which is used only to form the first openings 55 or the second openings 60 in the silicide protection film 52 or 57, is not required. Accordingly, a mask for the formation of a resist pattern used only to form openings in the silicide protection film 52 or 57 is not required, and a mask matching operation for the mask is not required. That is, the number of masks required to manufacture the eRAM can be reduced, and the number of mask matching operations required to manufacture the eRAM can be reduced.

Also, in the first embodiment, the first silicide layer 56 is formed on the N+ diffusion layer 19 of the peripheral circuit of the DRAM in the field 3 other than the memory cell unit 2 of the DRAM, and the second silicide layer 61 is formed on the P+ diffusion layer 21 of the peripheral circuit of the DRAM in the field 3. Accordingly, a high speed operation can be also performed in the peripheral circuit of the DRAM.

Embodiment 2

FIG. 4A, FIG. 4B, FIG. 4C, FIG. 5A, FIG. 5B, FIG. 5C and FIG. 6 are respectively sectional views showing steps of forming an eRAM in the step order according to a second embodiment of the present invention. In FIG. 4A to FIG. 6, steps of forming an NMOS arranged in the memory cell unit 2 of a DRAM are shown on the left side, and steps of forming both an NMOS with the first side wall spacer 26 and a PMOS with the second side wall spacer 27, which are arranged in the field 3 other than the memory cell unit 2 of the DRAM, are shown on the right side. Here, in FIG. 4A to FIG. 6, the bottom N well 12, the P wells 13 and 14, the N wells 15, a gate oxide film, the N⁻ diffusion layers 17 and 18, the N⁺ diffusion layer 19, the P⁻ diffusion layer 20 and the P⁺ diffusion layer 21 are omitted and not shown.

When eRAM is manufactured according to a second embodiment, the side wall spacer forming film 51 is formed in the same manner as in the first embodiment (refer to FIG. 1A).

Figure 4A:
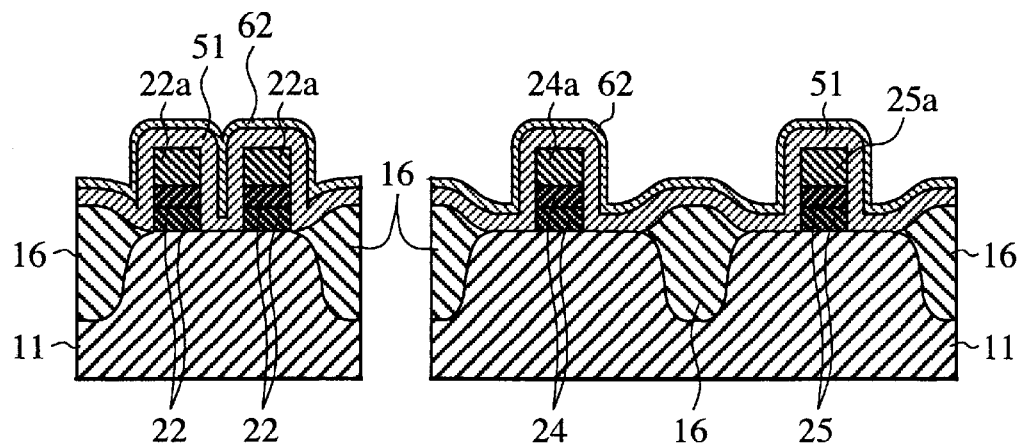
FIG. 4A, FIG. 4B, FIG. 4C, FIG. 5A, FIG. 5B, FIG. 5C and FIG. 6 are respectively sectional views showing steps of forming an eRAM in the step order according to a second embodiment of the present invention.
Figure 4B:
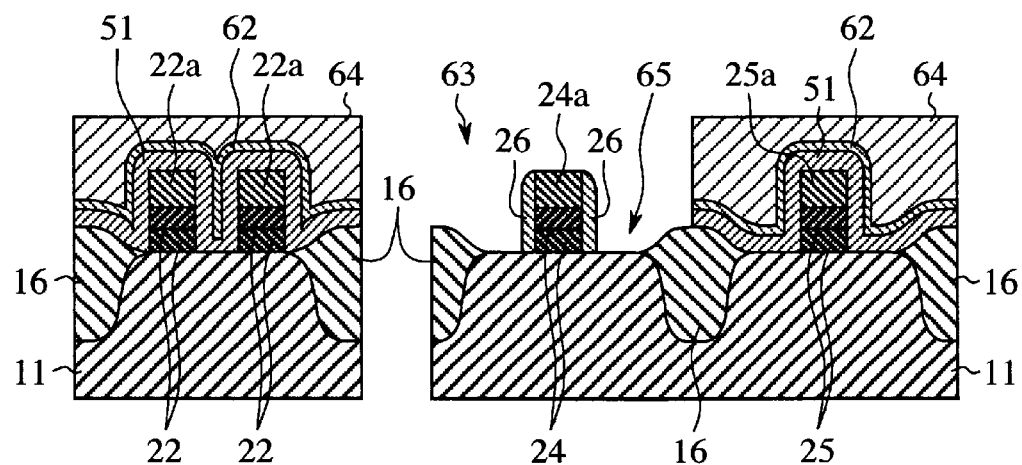

Thereafter, a silicide protection film 62 formed out of TEOS oxide film is deposited on the side wall spacer forming film 51 (refer to FIG. 4A). Thereafter, to form both the N⁺ diffusion layer 19 functioning as a source/drain diffusion layer of the NMOS of the logical circuit and the N⁺ diffusion layer 19 functioning as a source/drain diffusion layer of the NMOS of the peripheral circuit of the DRAM in the field 3 other than the memory cell unit 2 of the DRAM, a resist pattern (or a first resist pattern) 64 having a plurality of openings 63 at prescribed positions is formed on the silicide protection film 62. Thereafter, portions of the silicide protection film 62, which are exposed from the openings 63 of the resist pattern 64, are removed by etching. As a result, a plurality of first openings 65, which are placed at the same positions as those of the openings 63 of the resist pattern 64 and have the same shapes as those of the openings 63 of the resist pattern 64, are formed in the silicide protection film 62. Thereafter, anisotropic etching is performed for portions of the side wall spacer forming film 51 exposed from the openings 63 of the resist pattern 64, and the first side wall spacers 26 are respectively formed on a side wall of the gate electrode 24 of the NMOS of the logical circuit and a side wall of the gate electrode 24 of the NMOS of the peripheral circuit of the DRAM. Thereafter, ions of n-type impurity are injected into the silicon substrate 11 through the openings 63 of the resist pattern 64 to form the N⁺ diffusion layers 19 in the upper portion of the silicon substrate 11 (refer to FIG. 4B). Thereafter, the resist pattern 64 is removed (refer to FIG. 4C).

Thereafter, a metallic film made of cobalt is deposited on the whole surface area. Thereafter, the silicide process is performed. In this case, because the first openings 65 are formed in the silicide protection film 62 by using the resist pattern 64 which is used to form the N⁺ diffusion layers 19, the whole surface of the N⁺ diffusion layers 19 is exposed from the first openings 65. Therefore, a first silicide layer 66 made of $CoSi_2$ is formed on the N⁺ diffusion layer 19 of the NMOS, which is exposed from one first opening 65 of the silicide protection film 62, in the logical circuit, and another first silicide layer 66 made of $CoSi_2$ is formed on the N⁺ diffusion layer 19 of the NMOS, which is exposed from another first opening 65 of the silicide protection film 62, in the peripheral circuit of the DRAM (refer to FIG. 5A).

Thereafter, to form both the P⁺ diffusion layer 21 functioning as a source/drain diffusion layer of the PMOS of the logical circuit and the P⁺ diffusion layer 21 functioning as a source/drain diffusion layer of the PMOS of the peripheral circuit of the DRAM in the field 3 other than the memory cell unit 2 of the DRAM, a resist pattern (or a second resist pattern) 68 having a plurality of openings 67 at prescribed positions is formed on the whole surface area. Thereafter, portions of the silicide protection film 62, which are exposed from the openings 67 of the resist pattern 68, are removed by etching. As a result, a plurality of second openings 69, which are placed at the same positions as those of the openings 67 of the resist pattern 68 and have the same shapes as those of the openings 67 of the resist pattern 68, are formed in the silicide protection film 62. Thereafter, anisotropic etching is performed for portions of the side wall spacer forming film 51 exposed from the openings 67 of the resist pattern 68, and the second side wall spacers 27 are respectively formed on a side wall of the gate electrode 25 of the PMOS of the logical circuit and a side wall of the gate electrode 25 of the PMOS of the peripheral circuit of the DRAM. Thereafter, ions of p-type impurity are injected into the silicon substrate 11 through the openings 67 of the resist pattern 68 to form the P⁺ diffusion layers 21 in the upper portion of the silicon substrate 11 (refer to FIG. 5B). Thereafter, the resist pattern 68 is removed (refer to FIG. 5C).

Thereafter, a metallic film made of cobalt is deposited on the whole surface area. Thereafter, the silicide process is performed. In this case, because the second openings 69 are formed in the silicide protection film 62 by using the resist pattern 68 which is used to form the P⁺ diffusion layers 21, the whole surface of the P⁺ diffusion layers 21 is exposed from the second openings 69. Therefore, a second silicide layer 70 made of $CoSi_2$ is formed on the P⁺ diffusion layer 21 of the PMOS, which is exposed from one second opening 69 of the silicide protection film 62, in the logical circuit, and another second silicide layer 70 made of $CoSi_2$ is formed on the P⁺ diffusion layer 21 of the PMOS, which is exposed from another second opening 69 of the silicide protection film 62, in the peripheral circuit of the DRAM. Also, because the first openings 65 are formed in the silicide protection film 62 by using the resist pattern 64 which is used to form the N⁺ diffusion layers 19, the whole surface of the first silicide layer 66 formed on the N⁺ diffusion layers 19 is exposed from the first openings 65. Therefore, third silicide layers 71 are additionally formed on the first silicide layers 66 exposed from the first openings 65 of the silicide protection film 62 respectively (refer to FIG. 6).

Thereafter, the silicide protection film 62 not yet removed are removed by etching. Thereafter, the interlayer insulation film 32 is deposited on the whole surface area. Thereafter, the other constitutional components shown in FIG. 10 are formed.

Therefore, the eRAM is manufactured on condition that a combination of the first silicide layer 66 and the third silicide layer 71 or the second silicide layer 70 made of $CoSi_2$ is formed on each of the N⁺ diffusion layers 19 of the NMOS having the first side wall spacer 26 and the P⁺ diffusion layers 21 of the PMOS having the second side wall spacer 27 which are arranged in the logical circuit and the peripheral circuit of the DRAM.

As is described above, in the second embodiment, the forming step of the combinations of the first silicide layers 66 and the third silicide layers 71 placed on the N⁺ diffusion layers 19 differs from that of the second silicide layers 70 placed on the P⁺ diffusion layers 21. Accordingly, film thickness and quality of each combination of the first silicide layer 66 and the third silicide layer 71 can be adjusted independent of the adjustment of film thickness and quality of each second silicide layer 70, and combinations of silicide layers having characteristics optimum to the N⁺ diffusion layers 19 and silicide layers having characteristics optimum to the P⁺ diffusion layers 21 can be reliably formed.

Also, in the second embodiment, the first openings 65 are formed in the silicide protection film 62 by using the resist pattern 64 used for the formation of the N⁺ diffusion layers 19, and the first silicide layers 66 and the third silicide layers 71 placed on the N⁺ diffusion layers 19 are formed by using the first openings 65. Also, the second openings 69 is formed in the silicide protection film 62 by using the resist pattern 68 used for the formation of the P⁺ diffusion layers 21, and the second silicide layers 70 placed on the P⁺ diffusion layers 21 are formed by using the second openings 69. Therefore, a resist pattern, which is used only to form the first openings 65 or the second openings 69 in the silicide protection film 62, is not required. Accordingly, a mask for the formation of a resist pattern used only to form openings in the silicide protection film 62 is not required, and a mask matching operation for the mask is not required. That is, the number of masks required to manufacture the eRAM can be reduced, and the number of mask matching operations required to manufacture the eRAM can be reduced.

Also, in the second embodiment, the first silicide layer 66 is formed on the N⁺ diffusion layer 19 of the peripheral circuit of the DRAM in the field 3 other than the memory cell unit 2 of the DRAM, and the second silicide layer 70 is formed on the P⁺ diffusion layer 21 of the peripheral circuit of the DRAM in the field 3. Accordingly, a high speed operation can be also performed in the peripheral circuit of the DRAM.

Embodiment 3

Figure 7A:
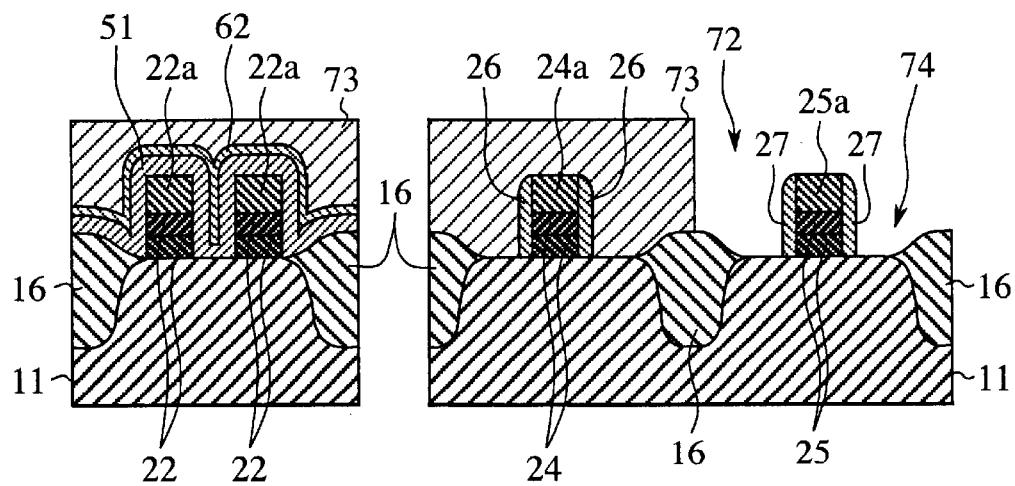
FIG. 7A, FIG. 7B and FIG. 7C are respectively sectional views showing steps of forming an eRAM in the step order according to a third embodiment of the present invention.
Figure 7B:
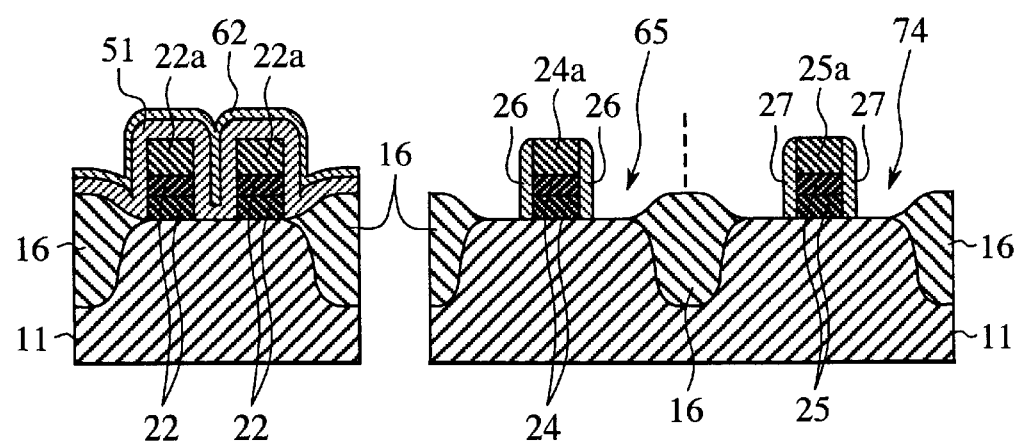
Figure 7C:
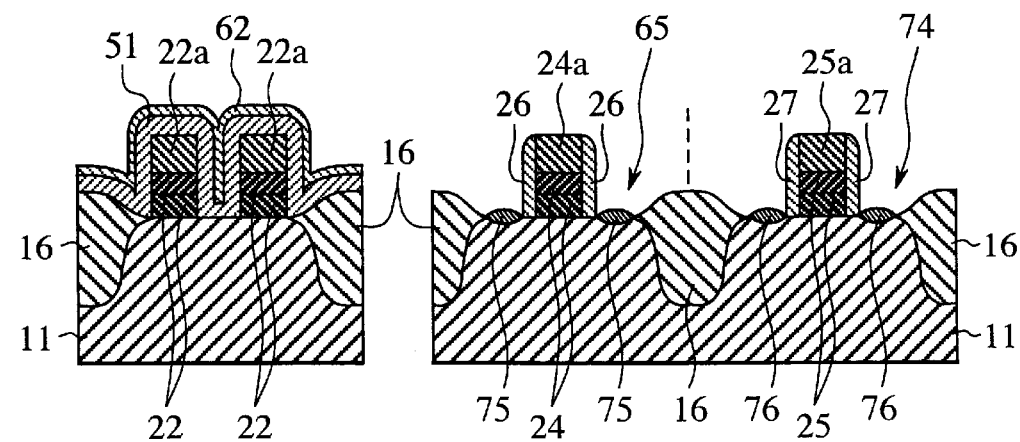

FIG. 7A, FIG. 7B and FIG. 7C are respectively sectional views showing steps of forming an eRAM in the step order according to a third embodiment of the present invention. In FIG. 7A to FIG. 7C, steps of forming an NMOS arranged in the memory cell unit 2 of a DRAM are shown on the left side, and steps of forming both an NMOS with the first side wall spacer 26 and a PMOS with the second side wall spacer 27, which are arranged in the field 3 other than the memory cell unit 2 of the DRAM, are shown on the right side. Here, in FIG. 7A to FIG. 7C, the bottom N well 12, the P wells 13 and 14, the N wells 15, a gate oxide film, the N⁻ diffusion layers 17 and 18, the N⁺ diffusion layer 19, the P⁻ diffusion layer 20 and the P⁺ diffusion layer 21 are omitted and not shown.

Figure 4C:
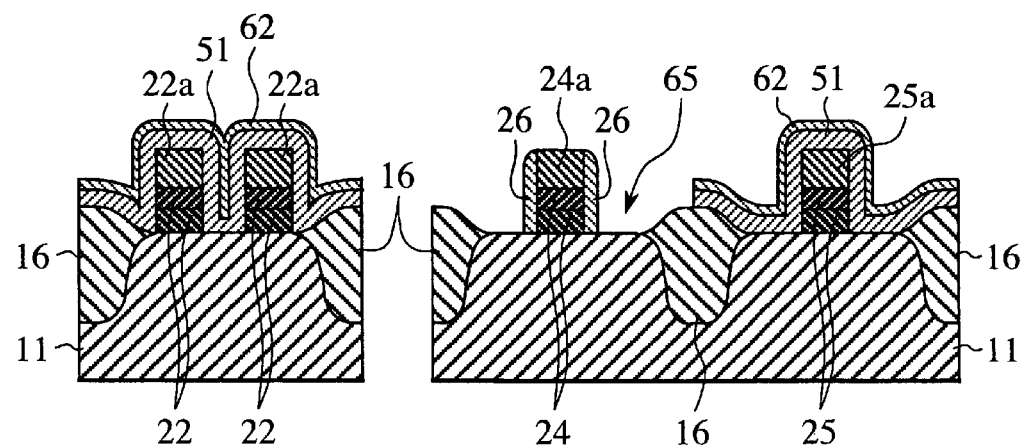
Figure 5A:
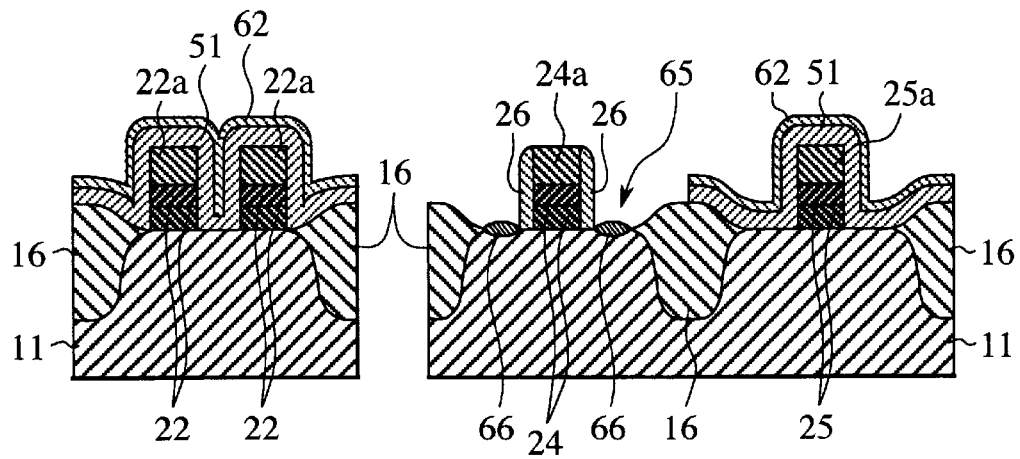
Figure 5B:
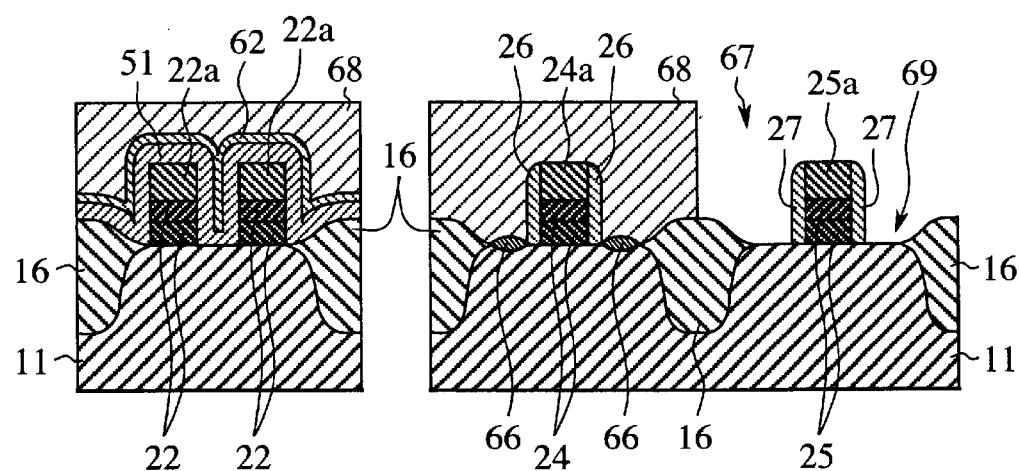
Figure 5C:
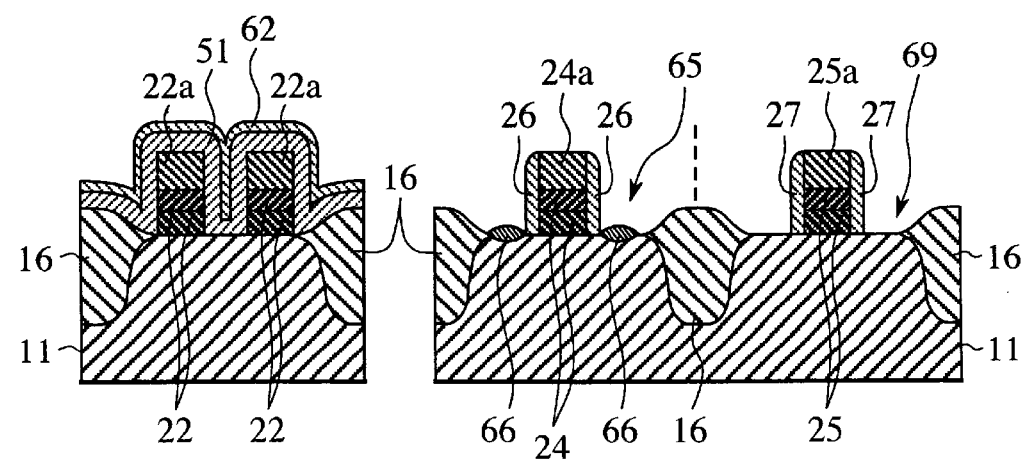
Figure 6:
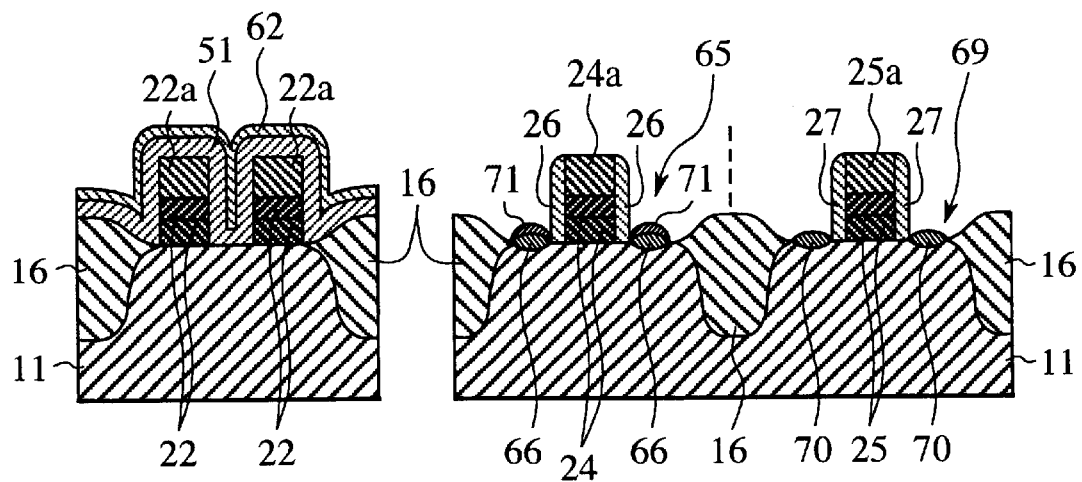

When eRAM is manufactured according to a third embodiment, the processing until the removal of the resist pattern 64 is performed in the same manner as in the second embodiment (refer to FIG. 4C).

Thereafter, to form both the P⁺ diffusion layer 21 functioning as a source/drain diffusion layer of the PMOS of the logical circuit and the P⁺ diffusion layer 21 functioning as a source/drain diffusion layer of the PMOS of the peripheral circuit of the DRAM in the field 3 other than the memory cell unit 2 of the DRAM, a resist pattern (or a second resist pattern) 73 having a plurality of openings 72 at prescribed positions is formed on the whole surface area. Thereafter, portions of the silicide protection film 62, which are exposed from the openings 72 of the resist pattern 73, are removed by etching. As a result, a plurality of second openings 74, which are placed at the same positions as those of the openings 72 of the resist pattern 73 and have the same shapes as those of the openings 72 of the resist pattern 73, are formed in the silicide protection film 62. Thereafter, anisotropic etching is performed for portions of the side wall spacer forming film 51 exposed from the openings 72 of the resist pattern 73, and the second side wall spacers 27 are respectively formed on a side wall of the gate electrode 25 of the PMOS of the logical circuit and a side wall of the gate electrode 25 of the PMOS of the peripheral circuit of the DRAM. Thereafter, ions of p-type impurity are injected into the silicon substrate 11 through the openings 72 of the resist pattern 73 to form the P⁺ diffusion layers 21 in the upper portion of the silicon substrate 11 (refer to FIG. 7A). Thereafter, the resist pattern 73 is removed (refer to FIG. 7B).

Thereafter, a metallic film made of cobalt is deposited on the whole surface area. Thereafter, the silicide process is performed. In this case, in the same manner as in the second embodiment, because the first openings 65 of the silicide protection film 62 are formed by using the resist pattern 64 which is used to form the N⁺ diffusion layers 19, the whole surface of the N⁺ diffusion layers 19 is exposed from the first openings 65. Therefore, a first silicide layer 75 made of $CoSi_2$ is formed on the N⁺ diffusion layer 19 of the NMOS, which is exposed from one first opening 65 of the silicide protection film 62, in the logical circuit, and another first silicide layer 75 made of $CoSi_2$ is formed on the N⁺ diffusion layer 19, which is exposed from another first opening 65 of the silicide protection film 62, in the NMOS of the peripheral circuit of the DRAM. Also, in this case, because the second openings 74 are formed in the silicide protection film 62 by using the resist pattern 73 which is used to form the P⁺ diffusion layers 21, the whole surface of the P⁺ diffusion layers 21 is exposed from the second openings 74. Therefore, a second silicide layer 76 made of $CoSi_2$ is formed on the P⁺ diffusion layer 21 of the PMOS, which is exposed from one second opening 74 of the silicide protection film 62, in the logical circuit, and another second silicide layer 76 made of $CoSi_2$ is formed on the P⁺ diffusion layer 21 of the PMOS, which is exposed from another second opening 74 of the silicide protection film 62, in the peripheral circuit of the DRAM.

Thereafter, the silicide protection film 62 not yet removed are removed by etching. Thereafter, the interlayer insulation film 32 is deposited on the whole surface area. Thereafter, the other constitutional components shown in FIG. 10 are formed.

Therefore, the eRAM is manufactured on condition that the first silicide layer 75 or the second silicide layer 76 made of $CoSi_2$ is formed on each of the N⁺ diffusion layers 19 of the NMOS having the first side wall spacer 26 and the P⁺ diffusion layers 21 of the PMOS having the second side wall spacer 27 which are arranged in the logical circuit and the peripheral circuit of the DRAM.

As is described above, in the third embodiment, the first openings 65 and the second openings 74 are formed in the first silicide protection film 62 by using the resist pattern 64 used for the formation of the N⁺ diffusion layers 19 and the P⁺ diffusion layers 21. Therefore, a resist pattern, which is used only to form the first openings 65 and/or the second openings 74 in the silicide protection film 62, is not required. Accordingly, a mask for the formation of a resist pattern used only to form openings in the silicide protection film 62 is not required, and a mask matching operation for the mask is not required. That is, the number of masks required to manufacture the eRAM can be reduced, and the number of mask matching operations required to manufacture the eRAM can be reduced.

Also, in the third embodiment, the first silicide layer 75 is formed on the N⁺ diffusion layer 19 of the peripheral circuit of the DRAM in the field 3 other than the memory cell unit 2 of the DRAM, and the second silicide layer 76 is formed on the P⁺ diffusion layer 21 of the peripheral circuit of the DRAM in the field 3. Accordingly, a high speed operation can be also performed in the peripheral circuit of the DRAM.

Embodiment 4

Figure 9:
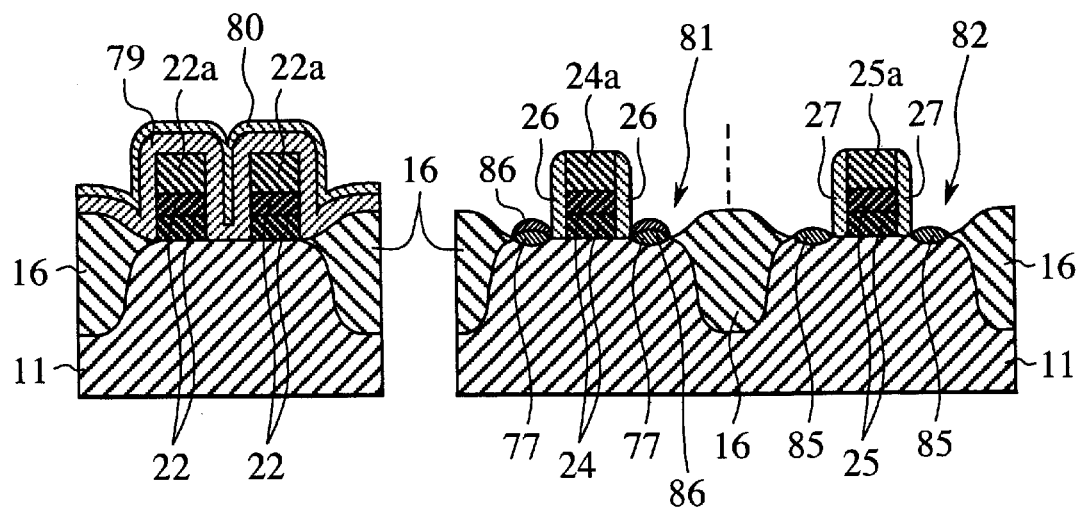
FIG. 8A, FIG. 8B, FIG. 8C and FIG. 9 are respectively sectional views showing steps of forming an eRAM in the step order according to a fourth embodiment of the present invention.
Figure 8A:
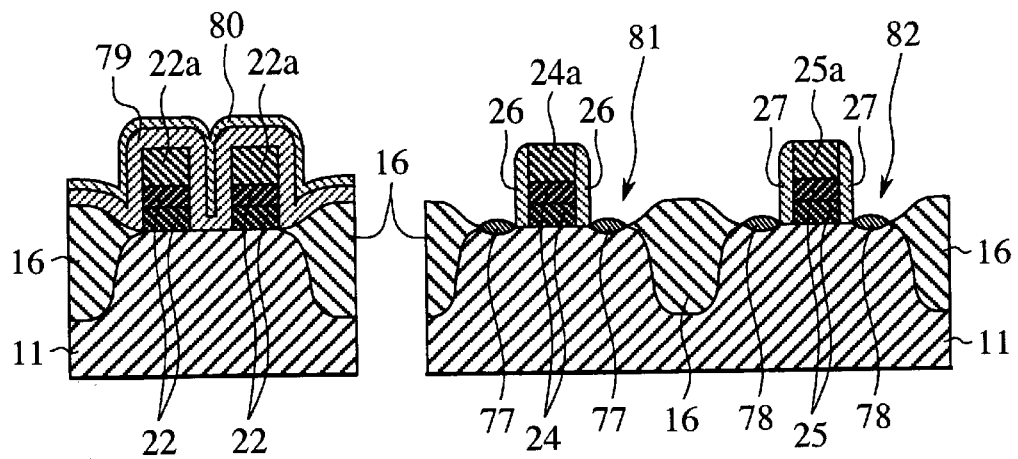
Figure 8B:
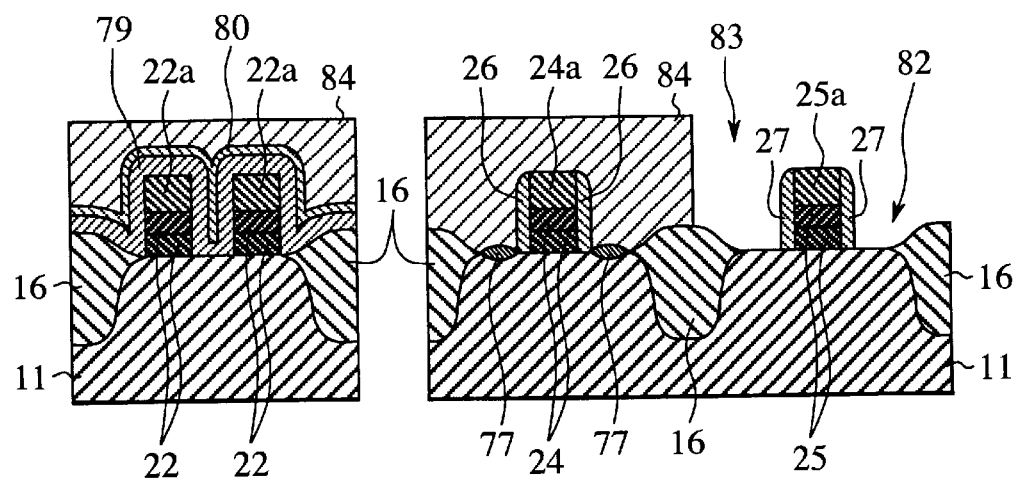
Figure 8C:
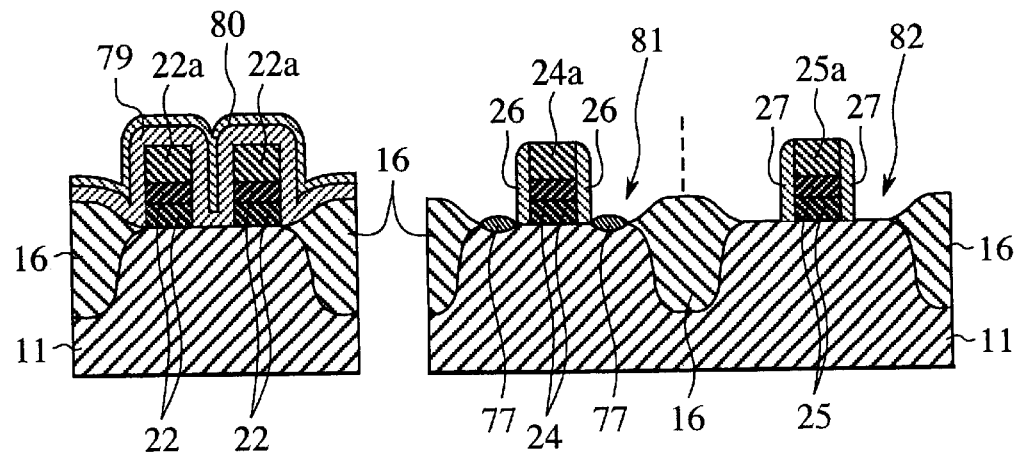

FIG. 8A, FIG. 8B, FIG. 8C and FIG. 9 are respectively sectional views showing steps of forming an eRAM in the step order according to a fourth embodiment of the present invention. In FIG. 8A to FIG. 9, steps of forming an NMOS arranged in the memory cell unit 2 of a DRAM are shown on the left side, and steps of forming both an NMOS with the first side wall spacer 26 and a PMOS with the second side wall spacer 27, which are arranged in the field 3 other than the memory cell unit 2 of the DRAM, are shown on the right side. Here, in FIG. 8A to FIG. 9, the bottom N well 12, the P wells 13 and 14, the N wells 15, a gate oxide film, the N⁻ diffusion layers 17 and 18, the N⁺ diffusion layer 19, the P⁻ diffusion layer 20 and the P⁺ diffusion layer 21 are omitted and not shown.

When eRAM is manufactured according to a fourth embodiment, forming steps, which are the same as those (refer to FIG. 1A, FIG. 4A to FIG. 4C, and FIG. 7A to FIG. 7C) of the third embodiment, are initially performed, or forming steps, which are the same as those (refer to FIG. 11A to FIG. 13B) of the prior art, are initially performed. Therefore, a plurality of first silicide layers 77 placed on the N⁺ diffusion layers 19 of the NMOS and a plurality of second silicide layers 78 placed on the P⁺ diffusion layers 21 of the PMOS are formed in the logical circuit and the peripheral circuit of the DRAM arranged in the field 3 in the same manner as in the third embodiment, or a silicide layer 77 placed on the N⁺ diffusion layer 19 of the NMOS and a second silicide layer 78 placed on the P⁺ diffusion layer 21 of the PMOS are formed in the logical circuit of the field 3 in the same manner as in the prior art (refer to FIG. 8A). In FIG. 8A to FIG. 9, reference numeral 79 indicates a side wall spacer forming film (corresponding to the side wall spacer forming film 51 or 101), 80 indicates a silicide protection film (corresponding to the silicide protection film 62 or 106), 81 indicates each of first openings (corresponding to the first openings 65 or 109) formed in the silicide protection film 80, and 82 indicates each of second openings (corresponding to the second openings 74 or 110) formed in the silicide protection film 80. To simplify the description of the fourth embodiment, the description of the silicide layers 77 and 78 formed in the peripheral circuit of the DRAM is omitted.

Thereafter, to remove the second silicide layer 78, a resist pattern 84 having an opening 83 at a prescribed position is formed on the whole surface area so as to expose the second silicide layer 78 from the opening 83. Thereafter, the second silicide layer 78 exposed from the openings 83 of the resist pattern 84 is removed by etching (refer to FIG. 8B). Thereafter, the resist pattern 84 is removed (refer to FIG. 8C).

Thereafter, a metallic film made of cobalt is deposited on the whole surface area. Thereafter, the silicide process is performed. Therefore, because a space, from which the second silicide layer 78 is removed, is exposed from the second opening 82 of the silicide protection film 80, a third silicide layer 85 made of CoSi₂ is formed in the space of the logical circuit. Also, a fourth silicide layer 86 is formed on the first silicide layer 77, which is exposed from the first opening 81 of the silicide protection film 80, in the logical circuit.

Thereafter, the silicide protection film 80 not yet removed is removed by etching. Thereafter, the interlayer insulation film 32 is deposited on the whole surface area. Thereafter, the other constitutional components shown in FIG. 10 are formed.

Therefore, the eRAM is manufactured on condition that the combination of the first silicide layer 77 and the fourth silicide layer 86 or the third silicide layer 85 made of CoSi₂ is formed on each of the N⁺ diffusion layer 19 of the NMOS having the first side wall spacer 26 and the P⁺ diffusion layer 21 of the PMOS having the second side wall spacer 27 which are arranged in the logical circuit.

As is described above, in the fourth embodiment, the forming step of the combination of the first silicide layer 77 and the fourth silicide layer 86 placed on the N⁺ diffusion layer 19 differs from that of the third silicide layer 85 placed on the P⁺ diffusion layer 21. Accordingly, film thickness and quality of the combination of the first silicide layer 77 and the fourth silicide layer 86 can be adjusted independent of the adjustment of film thickness and quality of the third silicide layer 85, and a combination of silicide layers having characteristics optimum to the N⁺ diffusion layer 19 and a silicide layer having characteristics optimum to the P⁺ diffusion layer 21 can be reliably formed.

What is claimed is:

1. A manufacturing method of a semiconductor device, in which a dynamic random access memory and a logical circuit are arranged, comprising:

a step of depositing a side wall spacer forming film and a first silicide protection film after forming a gate electrode on a gate oxide film formed on a silicon substrate;

a step of forming a first resist pattern having an opening at a prescribed position corresponding to a source/drain diffusion layer of a first conductive channel MOS transistor after depositing the first silicide protection film;

a step of removing a portion of the first silicide protection film exposed from the opening of the first resist pattern after the formation of the first resist pattern to form a first opening in the first silicide protection film;

a step of forming a first side wall spacer on a side wall of a gate electrode of the first conductive channel MOS transistor after the formation of the first opening and forming the source/drain diffusion layer of the first conductive channel MOS transistor;

a step of removing the first resist pattern and forming a first silicide layer on the source/drain diffusion layer of the first conductive channel MOS transistor exposed from the first opening of the first silicide protection film;

a step of depositing a second silicide protection film after the formation of the first silicide layer;

a step of forming a second resist pattern having an opening at a prescribed position corresponding to a source/drain diffusion layer of a second conductive channel MOS transistor after depositing the second silicide protection film;

a step of removing a portion of the second silicide protection film and a portion of the first silicide protection film exposed from the opening of the second resist pattern after the formation of the second resist pattern to form a second opening penetrating the second silicide protection film and the first silicide protection film;

a step of forming a second side wall spacer on a side wall of a gate electrode of the second conductive channel MOS transistor after the formation of the second opening and forming the source/drain diffusion layer of the second conductive channel MOS transistor; and a step of removing the second resist pattern and forming a second silicide layer on the source/drain diffusion layer of the second conductive channel MOS transistor exposed from the second opening of both the second silicide protection film and the first silicide protection film.

2. A manufacturing method of a semiconductor device, in which a dynamic random access memory and a logical circuit are arranged, comprising:

a step of depositing a side wall spacer forming film and a silicide protection film after forming a gate electrode on a gate oxide film formed on a silicon substrate;

a step of forming a first resist pattern having an opening at a prescribed position corresponding to a source/drain diffusion layer of a first conductive channel MOS transistor after depositing the silicide protection film;

a step of removing a portion of the silicide protection film exposed from the opening of the first resist pattern after the formation of the first resist pattern to form a first opening in the silicide protection film;

a step of forming a first side wall spacer on a side wall of a gate electrode of the first conductive channel MOS transistor after the formation of the first opening and forming the source/drain diffusion layer of the first conductive channel MOS transistor;

a step of removing the first resist pattern and forming a first silicide layer on the source/drain diffusion layer of the first conductive channel MOS transistor exposed from the first opening of the silicide protection film;

a step of forming a second resist pattern having an opening at a prescribed position corresponding to a source/drain diffusion layer of a second conductive channel MOS transistor after the formation of the first silicide layer;

a step of removing a portion of the silicide protection film exposed from the opening of the second resist pattern after the formation of the second resist pattern to form a second opening in the silicide protection film;

a step of forming a second side wall spacer on a side wall of a gate electrode of the second conductive channel MOS transistor after the formation of the second opening and forming the source/drain diffusion layer of the second conductive channel MOS transistor; and a step of removing the second resist pattern, forming a second silicide layer on the source/drain diffusion layer of the second conductive channel MOS transistor exposed from the second opening of the silicide protection film and forming a third silicide layer on the first silicide layer exposed from the first opening of the silicide protection film.

3. A manufacturing method of a semiconductor device, in which a dynamic random access memory and a logical circuit are arranged, comprising:

a step of depositing a side wall spacer forming film after forming a gate electrode on a gate oxide film formed on a silicon substrate;

a step of forming a first resist pattern having an opening at a prescribed position corresponding to a source/drain diffusion layer of a first conductive channel MOS transistor after depositing the side wall spacer forming film;

a step of forming a first side wall spacer on a side wall of a gate electrode of the first conductive channel MOS transistor after the formation of the first resist pattern and forming the source/drain diffusion layer of the first conductive channel MOS transistor;

a step of removing the first resist pattern and forming a second resist pattern having an opening at a prescribed position corresponding to a source/drain diffusion layer of a second conductive channel MOS transistor;

a step of forming a second side wall spacer on a side wall of a gate electrode of the second conductive channel MOS transistor after the formation of the second resist pattern and forming the source/drain diffusion layer of the second conductive channel MOS transistor;

a step of removing the second resist pattern and depositing a silicide protection film;

a step of forming a third resist pattern having a plurality openings so as to place one opening on the source/drain diffusion layer of the first conductive channel MOS transistor through the silicide protection film and to place another opening on the source/drain diffusion layer of the second conductive channel MOS transistor through the silicide protection film;

a step of removing portions of the silicide protection film exposed from the openings of the third resist pattern after the formation of the third resist pattern to form both a first opening placing on the source/drain diffusion layer of the first conductive channel MOS transistor and a second opening placing on the source/drain diffusion layer of the second conductive channel MOS transistor in the silicide protection film;

a step of forming a first silicide layer on the source/drain diffusion layer of the first conductive channel MOS transistor exposed from the first opening of the silicide protection film and forming a second silicide layer on the source/drain diffusion layer of the second conductive channel MOS transistor exposed from the second opening of the silicide protection film;

a step of removing the second silicide layer; and a step of forming a third silicide layer in a space, from which the second silicide layer is removed and which is exposed from the second opening of the silicide protection film, and forming a fourth silicide layer on the first silicide layer exposed from the first opening of the silicide protection film.

* * * * *